US012581705B2

(12) United States Patent
Lin et al.

(10) Patent No.: US 12,581,705 B2
(45) Date of Patent: Mar. 17, 2026

(54) SEMICONDUCTOR DEVICE INCLUDING MULTIPLE STACKS OF SEMICONDUCTOR NANOSHEETS, MULTIPLE STRAINED LAYERS, AND DIELECTRIC WALL LOCATED STRAINED LAYERS AND METHOD OF FORMING THE SAME

(71) Applicant: Taiwan Semiconductor Manufacturing Company, Ltd., Hsinchu (TW)

(72) Inventors: Ta-Chun Lin, Hsinchu (TW); Tzu-Hung Liu, Yunlin County (TW); Chun-Jun Lin, Hsinchu City (TW); Chih-Hao Chang, Hsin-Chu (TW); Jhon Jhy Liaw, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 567 days.

(21) Appl. No.: 18/150,808

(22) Filed: Jan. 6, 2023

(65) Prior Publication Data

US 2024/0079451 A1 Mar. 7, 2024

Related U.S. Application Data

(60) Provisional application No. 63/403,875, filed on Sep. 6, 2022.

(51) Int. Cl.
H10D 62/13 (2025.01)
H01L 21/764 (2006.01)
(Continued)

(52) U.S. Cl.
CPC ......... H10D 62/151 (2025.01); H01L 21/764 (2013.01); H10D 30/014 (2025.01);
(Continued)

(58) Field of Classification Search
CPC .. H10D 30/6735; H10D 30/43; H10D 30/014; H10D 62/121; H10D 62/151; H10D 30/6757; H01L 21/764
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Changhyun Yi
(74) *Attorney, Agent, or Firm* — Cooper Legal Group, LLC

(57) ABSTRACT

A semiconductor device includes a substrate, first and second stacks of semiconductor nanosheets, a gate structure, first and second strained layers and first and second dielectric walls. The substrate includes first and second fins. The first and second stacks of semiconductor nanosheets are disposed on the first and second fins respectively. The gate structure wraps the first and second stacks of semiconductor nanosheets. The first and second strained layers are respectively disposed on the first and second fins and abutting the first and second stacks of semiconductor nanosheets. The first dielectric wall is disposed on the substrate and located between the first and second strained layers. The second dielectric wall is disposed on the first dielectric wall and located between the first and second strained layers. A top surface of the second dielectric wall is lower than top surfaces of the first and second strained layers.

20 Claims, 28 Drawing Sheets

(51) Int. Cl.
  *H10D 30/01*       (2025.01)
  *H10D 30/43*       (2025.01)
  *H10D 30/67*       (2025.01)
  *H10D 62/10*       (2025.01)

(52) U.S. Cl.
  CPC ......... *H10D 30/43* (2025.01); *H10D 30/6735*
      (2025.01); *H10D 62/121* (2025.01)

(56)                    References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,164,942 B1 * | 11/2021 | Weckx ................. | H10D 62/121 |

* cited by examiner 276a    276b

248

274a

272a

232

246

240b

274b

G

272b

278b

278a

222

202

203    DW1'    203

248

276a    276b    264

240b

274a

274b

272a

G

232

272b

246

278b

278a

222

202

203    DW1'    203

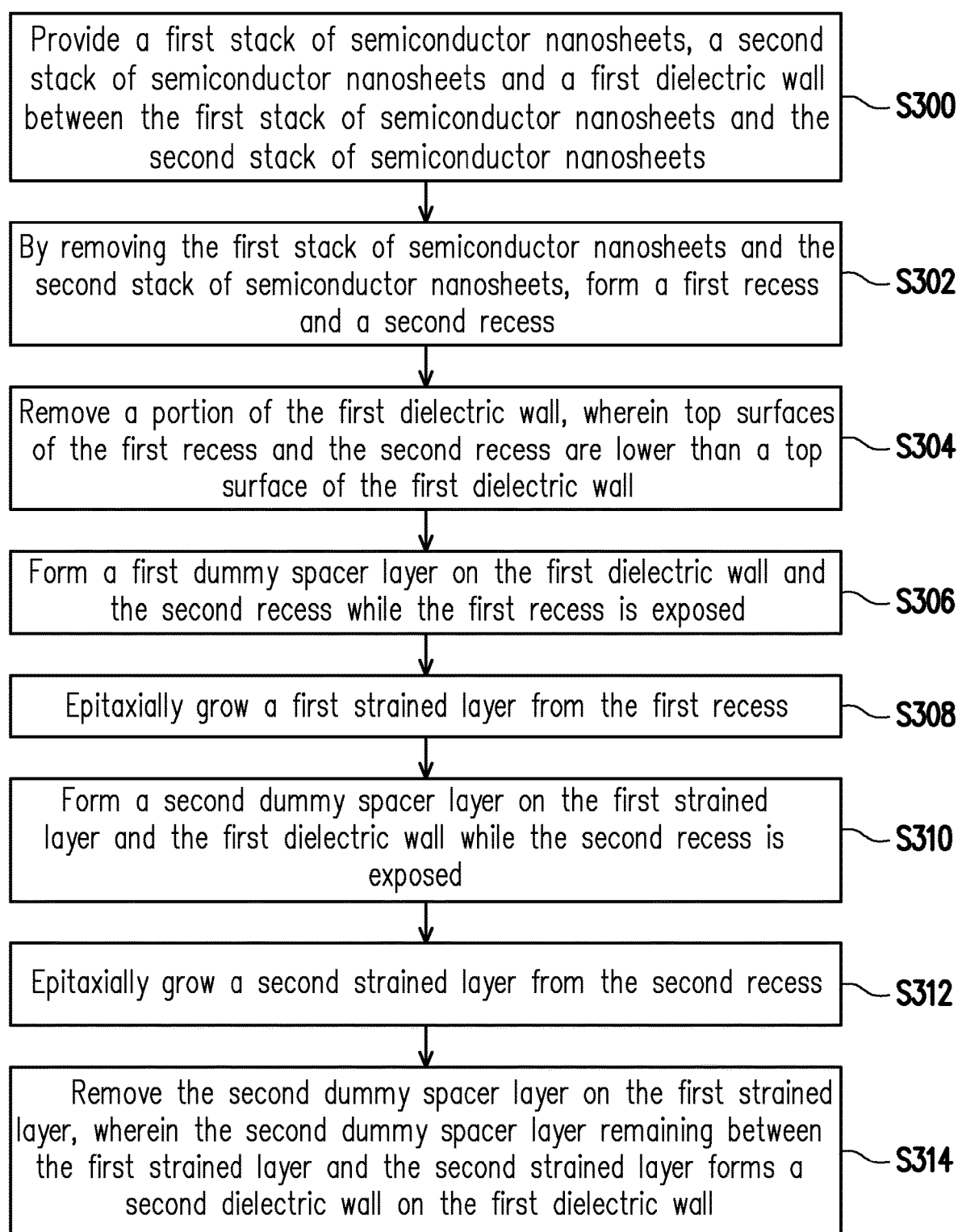

Provide a first stack of semiconductor nanosheets, a second stack of semiconductor nanosheets and a first dielectric wall between the first stack of semiconductor nanosheets and the second stack of semiconductor nanosheets —S300

By removing the first stack of semiconductor nanosheets and the second stack of semiconductor nanosheets, form a first recess and a second recess —S302

Remove a portion of the first dielectric wall, wherein top surfaces of the first recess and the second recess are lower than a top surface of the first dielectric wall —S304

Form a first dummy spacer layer on the first dielectric wall and the second recess while the first recess is exposed —S306

Epitaxially grow a first strained layer from the first recess —S308

Form a second dummy spacer layer on the first strained layer and the first dielectric wall while the second recess is exposed —S310

Epitaxially grow a second strained layer from the second recess —S312

Remove the second dummy spacer layer on the first strained layer, wherein the second dummy spacer layer remaining between the first strained layer and the second strained layer forms a second dielectric wall on the first dielectric wall —S314

FIG. 20

SEMICONDUCTOR DEVICE INCLUDING MULTIPLE STACKS OF SEMICONDUCTOR NANOSHEETS, MULTIPLE STRAINED LAYERS, AND DIELECTRIC WALL LOCATED STRAINED LAYERS AND METHOD OF FORMING THE SAME

CROSS-REFERENCE TO RELATED APPLICATION

This application claims the priority benefit of U.S. provisional application Ser. No. 63/403,875, filed on Sep. 6, 2022. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 illustrates a flow chart of a method of forming a semiconductor structure in accordance with some embodiments.

DETAILED DESCRIPTION

Figure 1A:
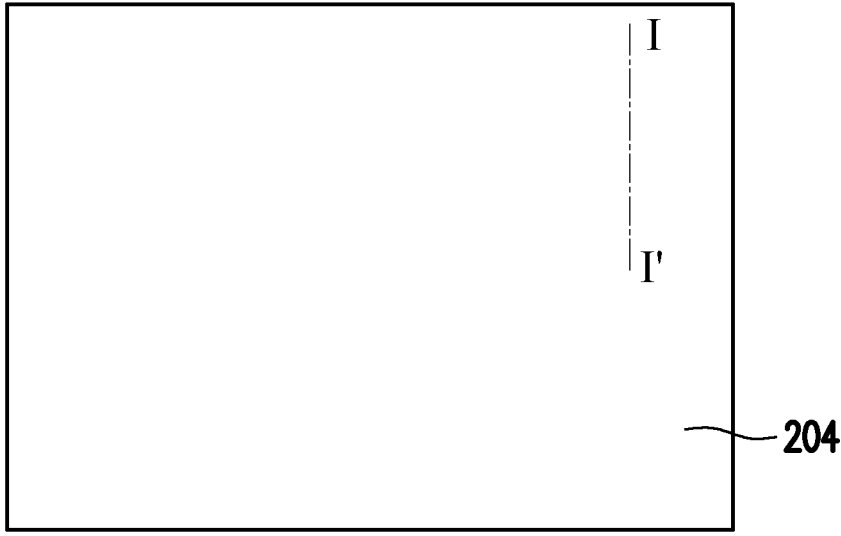
FIG. 1A illustrates a view of a part of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Embodiments of the present disclosure may be used to form gate stacks suitable for use in planar bulk metal-oxide-semiconductor field-effect transistors (MOSFETs), multi-gate transistors (planar or vertical) such as forksheet FET devices, FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of p-type and/or n-type devices. One of ordinary skill may recognize other embodiments of semiconductor devices that may benefit from aspects of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1A to FIG. 14C illustrate varying views of a method of forming a semiconductor device in accordance with some embodiments. The semiconductor device illustrated in the following embodiments may be, but not limited to, a multi-gate device. As used herein, the term "multi-gate device" is used to describe a device (e.g., a semiconductor transistor) that has at least some gate material disposed on multiple sides of at least one channel of the device. In some examples, the multi-gate device is also referred to as a gate-all-around (GAA) device having a gate material disposed on four sides of at least one channel member of the device. The channel member may be referred to as "nanosheet" or "nanowire" which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example but not limited to, a cylindrical in shape or substantially rectangular cross-section. The method is merely an example, and is not intended to limit the present disclosure beyond what is explicitly recited in the claims. Additional steps may be provided before, during, and after method, and some of the steps described can be moved, replaced, or eliminated for additional embodiments of method. Additional features may be added in the semiconductor device depicted in FIG. 1A to FIG. 14C and some of the features described below can be replaced, modified, or eliminated in other embodiments of the semiconductor device.

FIG. 1A to FIG. 4A illustrate top views of stages of forming a semiconductor device. FIG. 1B to FIG. 3B illustrate cross-sectional views taken along lines I-I' of FIG. 1A to FIG. 3A. FIG. 4B illustrates a cross-sectional view taken along line II-II' of FIG. 4A. Referring to FIG. 1A and FIG. 1B, a substrate 202 is provided. In some embodiments, the substrate 202 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or a combination thereof. The substrate 202 may include various doped regions (e.g., p-type well and/or n-type well) depending on design requirements. In some embodiments, the doped regions are doped with p-type or n-type dopants. The doped regions may be configured for an n-type device, or alternatively, configured for a p-type device. In some embodiments, an anti-punch-through (APT) implantation is performed on a top portion of the substrate 202 to form an APT region. The conductivity type of the dopants implanted in the APT region is the same as that of the doped regions (or wells). The APT region may extend under the subsequently formed strained layers, and are used to reduce the leakage from the strained layers to the substrate 202. The strained layers are referred to "source/drain regions" in some examples. Source/drain region(s) may refer to a source or a drain, individually or collectively dependent upon the context. For clarity, the doped regions and the APT region are not illustrated in FIG. 1A and FIG. 1B and subsequent drawings.

In some embodiments, a semiconductor stack 210 is formed over the substrate 202. The semiconductor stack 210 includes first blanket layers 204 and second blanket layers 206 stacked alternately. The first and second blanket layers are referred to as "first and second layers", "first and second materials", "first and second compositions" or "first and second semiconductor materials" in some examples. As described in more detail below, the second blanket layer 206 may serve as channel region(s) for a subsequently formed multi-gate device and its thickness chosen based on device performance considerations. The first blanket layer 204 may be configured to define a gap between adjacent channel region(s) for a subsequently formed multi-gate device and its thickness chosen based on device performance considerations.

The first blanket layers 204 and second blanket layers 206 include different materials. The first blanket layers 204 and the second blanket layers 206 have materials with different etching selectivity. In some embodiments, the first blanket layers 204 are SiGe layers having a germanium percentage in the range between about 15 wt % and 40 wt %, and the second blanket layers 206 are Si layers free of germanium. In other embodiments, either of the first blanket layers 204 and second blanket layers 206 may include other materials such as germanium, a compound semiconductor (e.g., silicon carbide, gallium arsenide, gallium phosphide, indium phosphide, indium arsenide, or indium antimonide), an alloy semiconductor (e.g., SiGe, GaAsP, AlInAs, AlGaAs, InGaAs, GaInP, or GaInAsP), the like, or a combination thereof. The second blanket layers 206 may be of first conductive type (e.g., n-type) or second conductive type (e.g., p-type).

In some embodiments, the first blanket layers 204 and the second blanket layers 206 are formed by an epitaxial growth process, such as a molecular beam epitaxy (MBE) process, a metalorganic chemical vapor deposition (MOCVD) process, or the like. In the case, the first blanket layers 204 are epitaxial SiGe layers, and the second blanket layers 206 are epitaxial Si layers. In some embodiments, the first and second blanket layers 204 and 206 are substantially dopant-free (i.e., having an extrinsic dopant concentration from about 0 $cm^{-3}$ to about $1\times10^{17}$ $cm^{-3}$), where for example, no intentional doping is performed during the epitaxial growth process. In other embodiments, the first blanket layers 204 and the second blanket layers 206 are formed by a suitable deposition, such as chemical vapor deposition (CVD), atomic layer deposition (ALD), or the like. In the case, the first blanket layers 204 are poly-SiGe layers, and the second blanket layers 206 are poly-Si layers. In some embodiments, each of the first blanket layers 204 and the second blanket layers 206 has a thickness ranging from about 5 nm to about 15 nm.

Figure 1B:
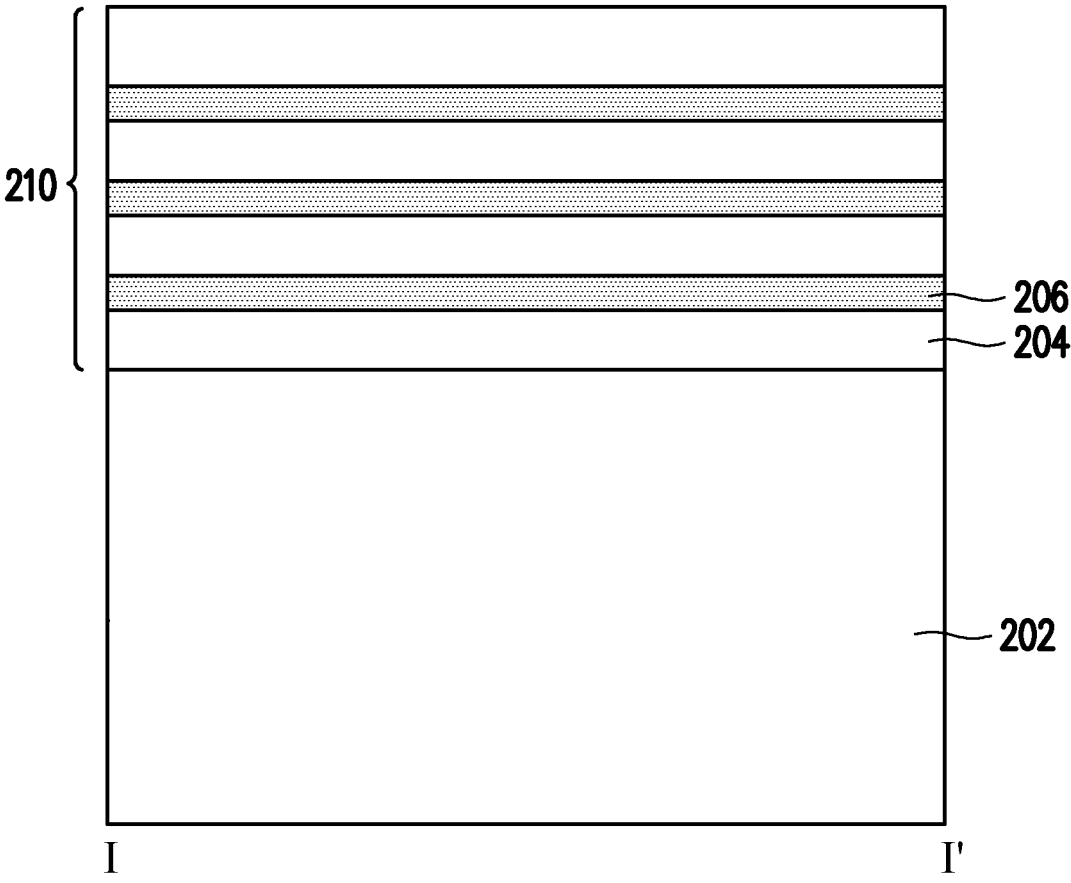
FIG. 1B illustrates a view of a part of a method of forming a semiconductor device in accordance with some embodiments.

In the illustrated embodiment, the bottom layer and the top layer of the semiconductor stack 210 are SiGe layers. However, the disclosure is not limited thereto. In other embodiments (not shown), the bottom layer of the semiconductor stack 210 is a Si layer and the top layer of the semiconductor stack 210 is a SiGe layer. It is noted that four layers of first blanket layers 204 and three layers of second blanket layers 206 are illustrated in FIG. 1B, which is for illustrative purposes only and not intended to be limiting beyond what is specifically shown in the drawings. Specifically, any number of epitaxial layers may be formed in the semiconductor stack 210; the number of layers depending on the desired number of channel regions for the semiconductor device.

Figure 2A:
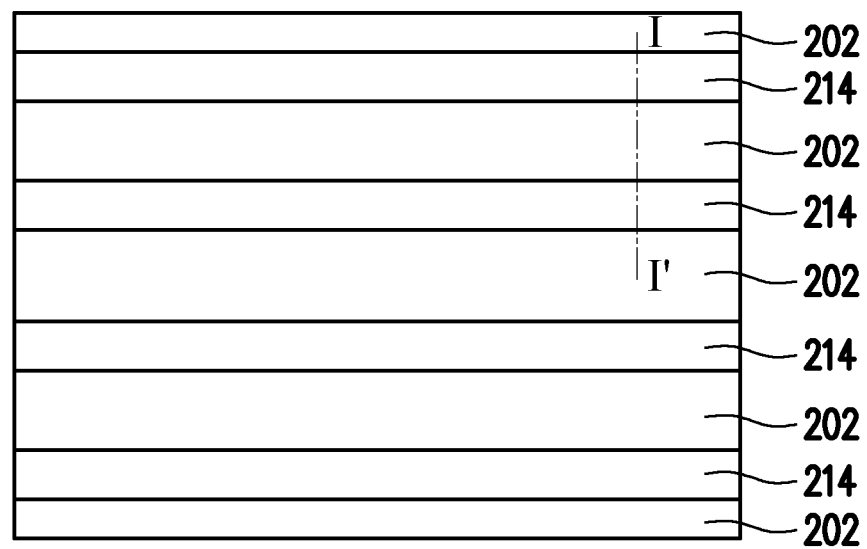
FIG. 2A illustrates a view of a part of a method of forming a semiconductor device in accordance with some embodiments.
Figure 2B:
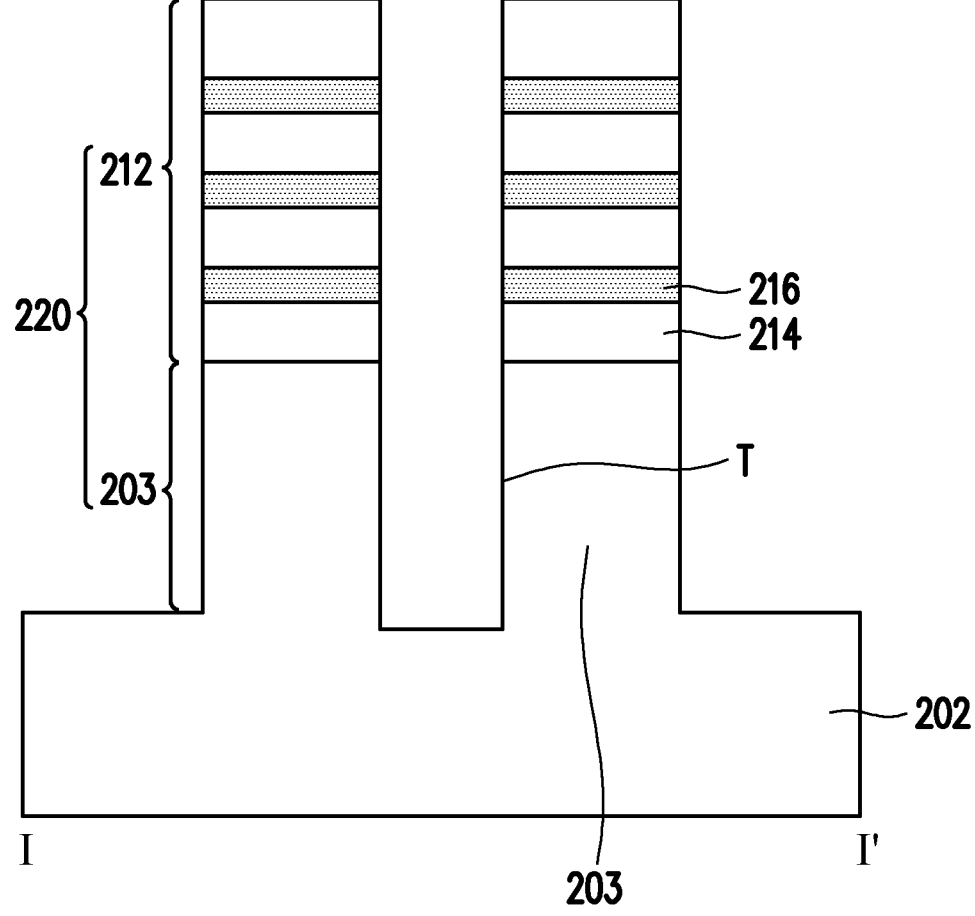
FIG. 2B illustrates a view of a part of a method of forming a semiconductor device in accordance with some embodiments.

Referring to FIG. 2A and FIG. 2B, the semiconductor stack 210 is patterned to form a plurality of semiconductor strips 220. In some embodiments, a mask layer (not shown) is formed on the semiconductor stack 210. The mask layer may include a dielectric material, such as silicon oxide, silicon nitride, SiON, SiC, SiCN, SiCON, the like, or a combination thereof. Other materials such as a low-k material may be applicable. The low-k material has a dielectric constant less than 3.9, less than 3, less than 2.5, or even less. In some embodiments, the mask layer includes a first mask layer and a second mask layer over the second mask layer. For example, the first mask layer is a pad oxide layer made of a silicon oxide, which may be formed by a thermal oxidation. The second mask layer is made of a silicon nitride (SiN), which is formed by chemical vapor deposition (CVD), low pressure CVD (LPCVD), plasma enhanced CVD (PECVD), physical vapor deposition (PVD), atomic layer deposition (ALD), or a suitable process. The mask layer is then patterned into a plurality of mask strips (not shown) by using photolithography and etching processes.

Then, the semiconductor stack 210 and the substrate 202 are patterned by using the mask strips as a mask, so as to form the semiconductor strips 220 separated by trenches T. The patterning process includes an etching process, such as a dry etching or the like. As shown in FIG. 2B, the trenches T extend into the substrate 202, and have lengthwise directions parallel to each other. Herein, the semiconductor strips 220 are referred to as "hybrid fins" in some examples. In some embodiments, each of the semiconductor strips 220 includes a fin 203 protruding from the substrate 202, and a nanosheet stack 212 on the fin 203. In some embodiments, the nanosheet stack 212 includes first nanosheets 214 and second nanosheets 216 stacked alternately. The nanosheets are referred to as "nanowires" or "semiconductor nanosheets" in some examples. In some embodiments, the first nanosheets 214 are referred to as "sacrificial portions", "dummy portions" or "dummy regions" which will be subsequently removed and replaced by a metal gate structure, and the second nanosheets 216 are referred to as "channel members", "channel portions" or "channel regions" which will serve as semiconductor channels. Although only two semiconductor strips 220 are illustrated in FIG. 2A and FIG. 2B, the embodiments of the present disclosure are not limited thereto. In other embodiments, the number of the semiconductor strips 220 may be adjusted as needed. The adjacent semiconductor strips 220 may have the same width or different widths.

Figure 3A:
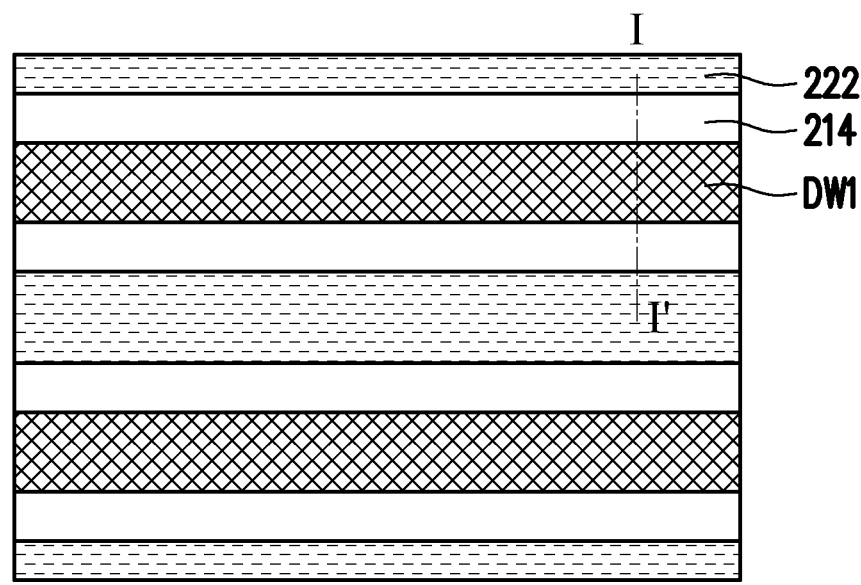
FIG. 3A illustrates a view of a part of a method of forming a semiconductor device in accordance with some embodiments.
Figure 3B:
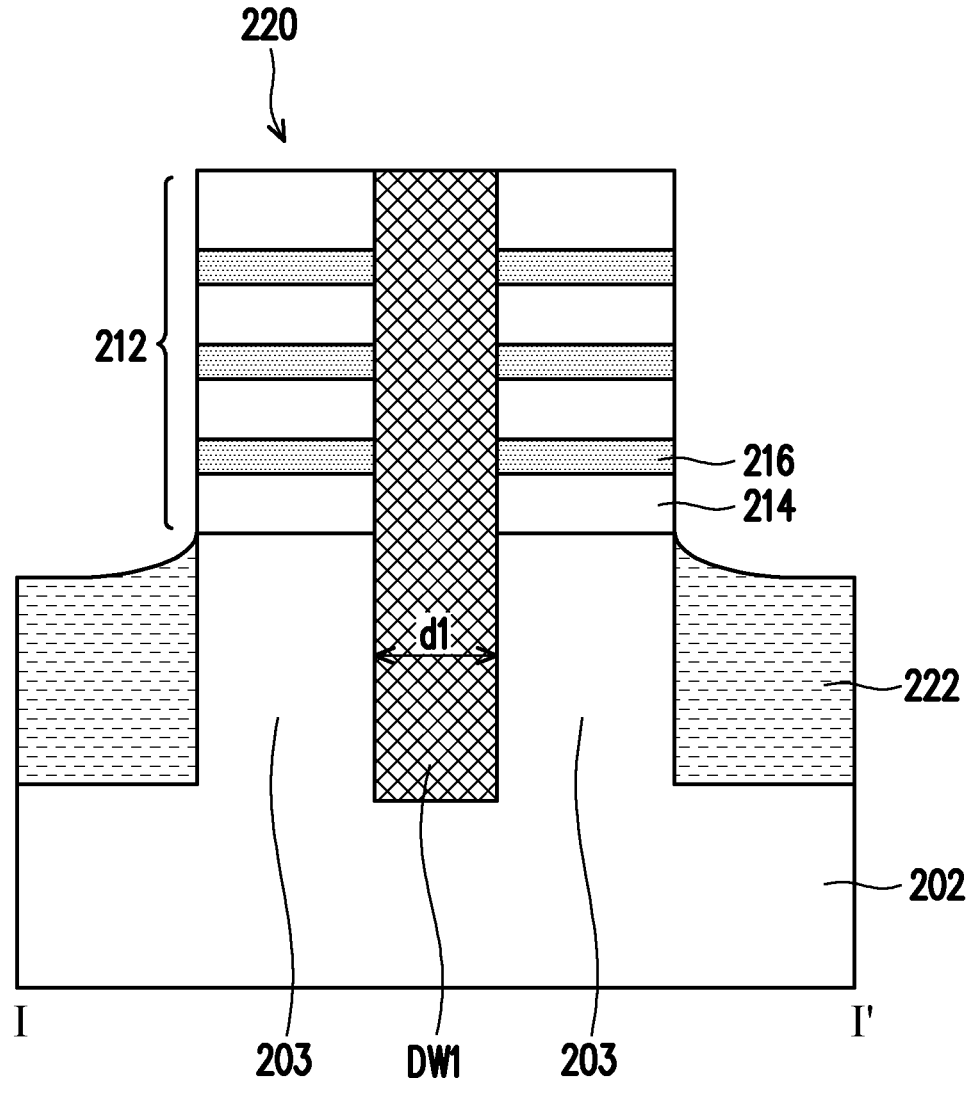
FIG. 3B illustrates a view of a part of a method of forming a semiconductor device in accordance with some embodiments.

Referring to FIG. 3A and FIG. 3B, dielectric walls DW1 and insulating regions 222 are alternately formed in the trenches T between the semiconductor strips 220. The insulating regions 222 may be formed before or after the formation of the dielectric walls DW1. In some embodiments, the dielectric walls DW1 and the insulating regions 222 have different materials. The dielectric walls DW1 may include a dielectric material, such as silicon oxide, silicon nitride, SiON, SiC, SiCN, SiCO, SiCON, a high-k material, the like, or a combination thereof. The high-k material includes metal oxide, such as $HfO_2$, HfSiO, HfSiON, HfTaO, HfTiO, HfZrO, zirconium oxide, aluminum oxide ($Al_2O_3$ or $AlSiO_x$), titanium oxide, hafnium dioxide-alumina ($HfO_2$—$Al_2O_3$) alloy, the like, or combinations thereof. The high-k material has a dielectric constant less than 8, less than 15, less than 20, or even more. Other materials such as a low-k material may be applicable, which mitigates electrical coupling between n-type and p-type strained layers. The low-k material has a dielectric constant less than 3.9, less than 3, less than 2.5, or even less. The dielectric wall DW1 has a single-layer structure or a multi-layer structure. For example, the dielectric wall DW1 has multi-layer structure for low-K and breakdown voltage. The insulating regions 222 may include silicon oxide, silicon nitride, silicon oxynitride, a spin-on dielectric material, or a low-k material. The low-k material has a dielectric constant less than 3.9, less than 3, less than 2.5, or even less.

The dielectric walls DW1 and the insulating regions 222 may be formed by flowable chemical vapor deposition (FCVD), high-density-plasma chemical vapor deposition (HDP-CVD), sub-atmospheric CVD (SACVD), or spin-on process. A planarization process may be performed to remove a portion of the material of the dielectric walls DW1, until the semiconductor strips 220 are exposed. In some embodiments, the planarization process includes a chemical mechanical polish (CMP), an etching back process, the like, or a combination thereof. In alternative embodiments, the dielectric wall material is formed in the trenches T and covers top surfaces of the semiconductor strips 220 using a self-aligned process, and the dielectric wall material is partially removed to expose the semiconductor strips 220 and some of the trenches T using an etching process. In some embodiments, as shown in FIG. 3B, top surfaces of the dielectric walls DW1 are substantially coplanar with the top surfaces of the semiconductor strips 220. The dielectric walls DW1 may have a horizontal dimension d1 (e.g., width) ranging from about 15 nm to about 40 nm.

In some embodiments, after the formation of the dielectric walls DW1, the insulating regions 222 are formed in the exposed trenches T. In some embodiments, the insulating regions 222 are recessed, until the semiconductor strips 220 protrude from top surfaces of the remaining insulating regions 222. Specifically, after the recessing operation, the top surfaces of the insulating regions 222 are lower than the top surfaces of the semiconductor strips 220 and the nanosheet stacks 212 are exposed by the insulating regions 222. In some embodiments, the top surfaces of the insulating regions 222 are also lower than the top surfaces of the dielectric walls DW1. The top surfaces of the insulating regions 222 may be substantially coplanar with or lower than bottom surfaces of the nanosheet stacks 212. Further, the top surfaces of the insulating regions 222 may have a flat surface, a convex surface, a concave surface (such as dishing), or a combination thereof. In some embodiments, the insulating regions 222 are recessed by using an appropriate etching process, such as a wet etching process with hydrofluoric acid (HF), a dry etching process, or a combination thereof. In some embodiments, a height difference between the top surfaces of the semiconductor strips 220 and the top surfaces of the insulating regions 222 ranges from about 30 nm to about 100 nm. The insulating regions 222 are referred to as "isolation strips", "shallow trench isolation (STI) regions" or "deep trench isolation (DTI) regions" in some examples.

Figure 4A:
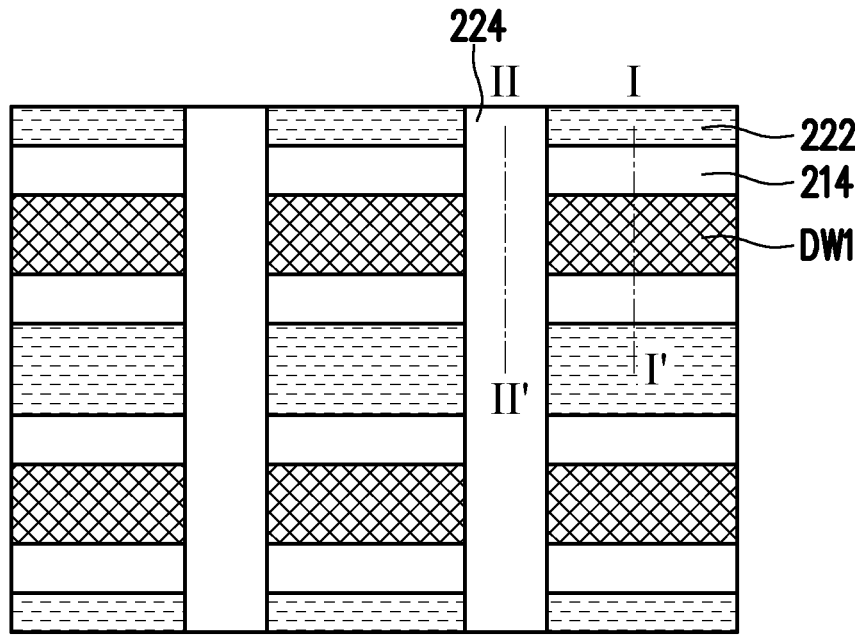
FIG. 4A illustrates a view of a part of a method of forming a semiconductor device in accordance with some embodiments.
Figure 4B:
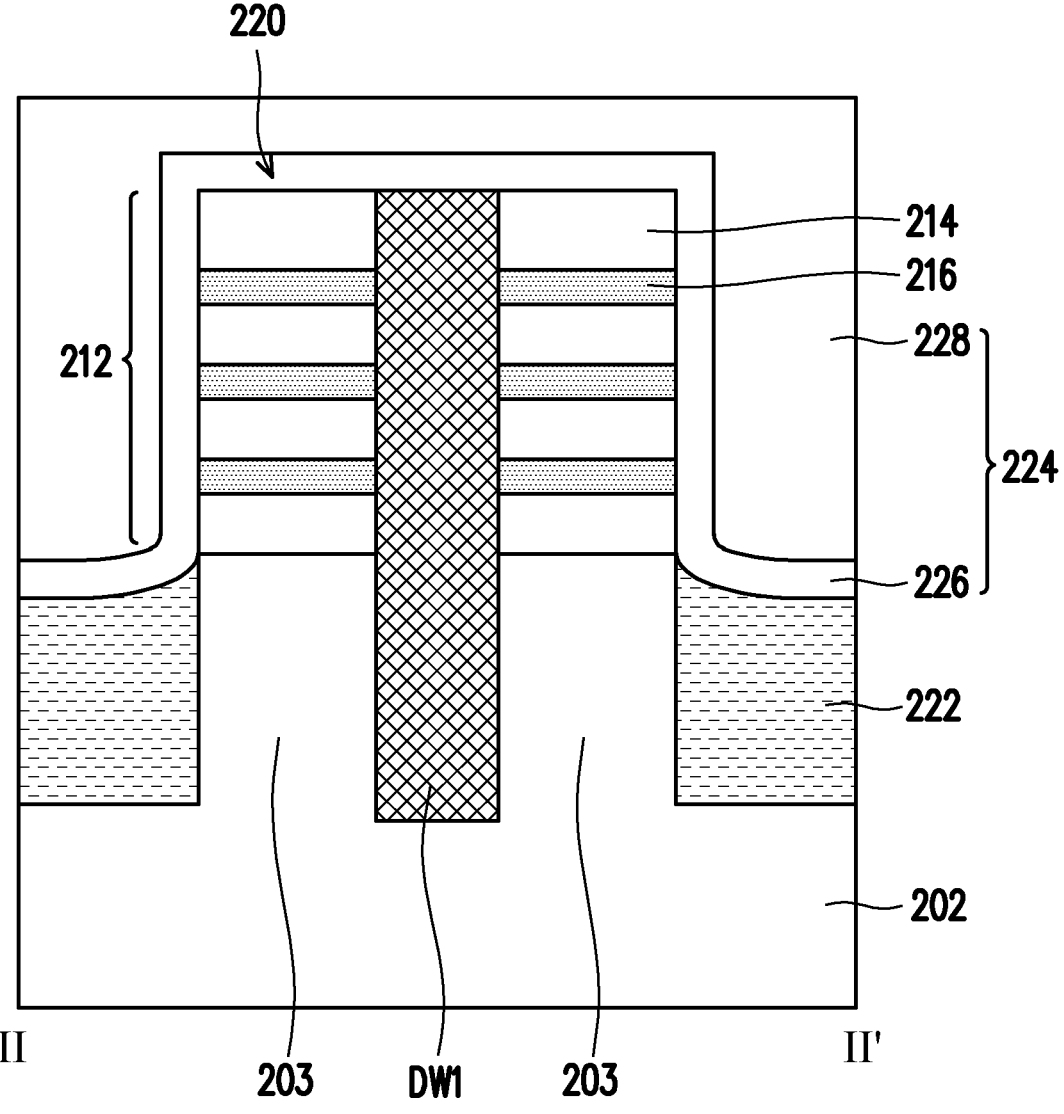
FIG. 4B illustrates a view of a part of a method of forming a semiconductor device in accordance with some embodiments.

Referring to FIG. 4A and FIG. 4B, in some embodiments, after formation of the dielectric walls DW1 and the insulating regions 222, at least one dummy gate stack 224 is formed across portions of the dielectric walls DW1, the nanosheet stacks 212 and the insulating regions 222. The dummy gate stack 224 may extend along a direction different from (e.g., perpendicular to) the extending direction of the nanosheet stacks 212. The dummy gate stack 224 defines the channel regions of the GAA device. The dummy gate stack 224 includes a dummy gate dielectric layer 226 and a dummy gate electrode layer 228 over the dummy gate dielectric layer 226. In some embodiments, a dummy gate dielectric material and a dummy gate electrode material are blanket-formed over the semiconductor strips 220. The dummy gate dielectric material includes silicon oxide such as low temperature oxide (LTO), silicon nitride, silicon oxynitride, high-k dielectrics, or a combination thereof. In some embodiments, the dummy gate electrode material has an etching selectivity with respect to the second nanosheets 216. For example, the dummy gate electrode material includes polysilicon. The dummy gate dielectric material and the dummy gate electrode material are deposited using CVD, LPCVD, PECVD, PVD, ALD, or a suitable process. A mask layer (not shown) may be formed over the dummy gate electrode material. The mask layer may include a dielectric material, such as silicon oxide, silicon nitride, SiON, SiC, SiCN, SiCON, the like, or a combination thereof. Other materials such as a low-k material may be applicable. The low-k material has a dielectric constant less than 3.9, less than 3, less than 2.5, or even less. In some embodiments, the mask layer includes a first mask layer (e.g., silicon oxide layer) and a second mask layer (e.g., silicon nitride layer) over the first mask layer. Thereafter, the dummy gate dielectric material and dummy gate electrode material are patterned into the dummy gate stack 224 by using the mask layer as a mask. The mask layer is regarded as part of the dummy gate stack 224 in some examples.

Figure 5:
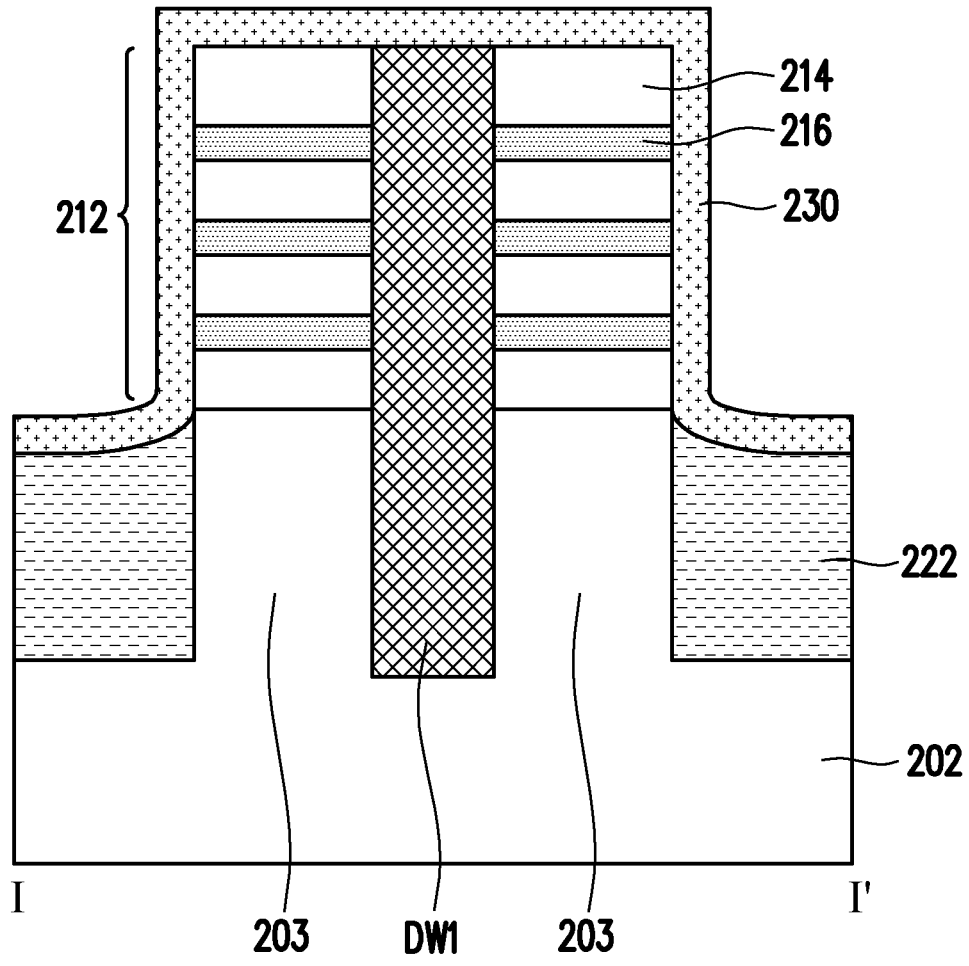
FIG. 5 illustrates a view of a part of a method of forming a semiconductor device in accordance with some embodiments.

FIG. 5 to FIG. 11 illustrate cross-sectional views taken along lines I-I' of FIG. 3A. It is noted that in some embodiments, when performing the processes of FIG. 5 to FIG. 11, the channel members (or called channel regions) of the nanosheet stacks 212 is covered by the dummy gate stack 224 as shown in FIG. 4A and FIG. 4B. Referring to FIG. 5, a spacer material 230 is formed on exposed surfaces of the nanosheet stacks 212 and the dielectric wall DW1 therebetween. For example, spacer material 230 is conformally deposited on sidewalls of the nanosheet stacks 212 and the top surfaces of the nanosheet stacks 212 and the dielectric wall DW1. In some embodiments, the spacer material 230 includes a dielectric material, such as silicon oxide, silicon nitride, SiON, SiC, SiCN, SiCON, or a combination thereof. Other materials such as a low-k material may be applicable. The low-k material has a dielectric constant less than 3.9, less than 3, less than 2.5, or even less. Although the spacer material 230 illustrated in FIG. 5 have a single-layer structure, the embodiments of the present disclosure are not limited thereto. In other embodiments, the spacer material 230 has a multi-layer structure. For example, the spacer material 230 includes a silicon oxide material and a silicon nitride material on the silicon oxide material.

Figure 6:
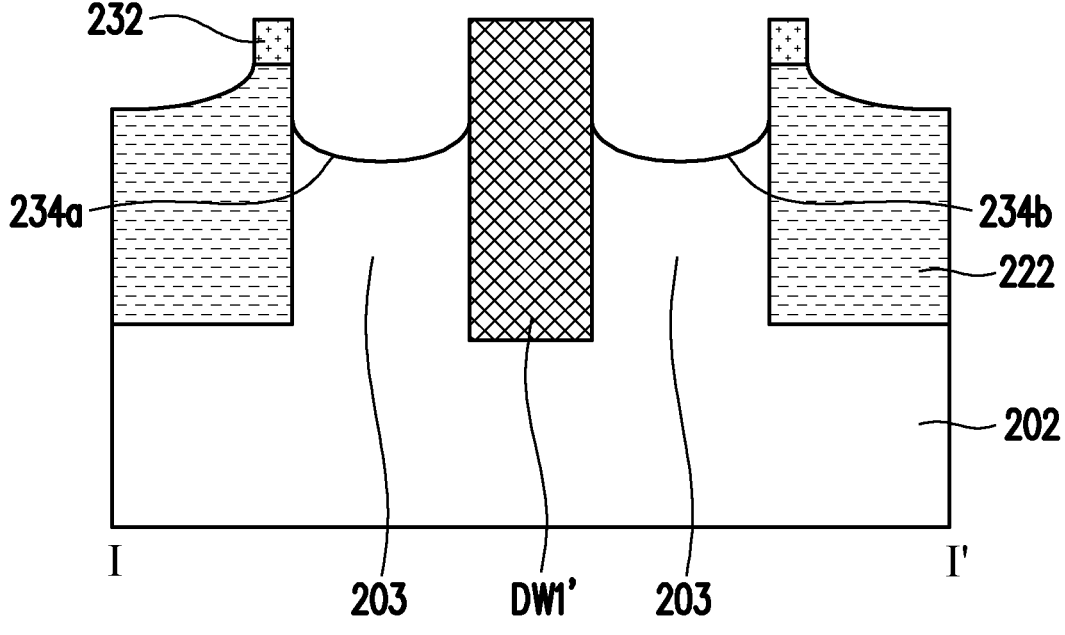
FIG. 6 illustrates a view of a part of a method of forming a semiconductor device in accordance with some embodiments.

As shown in FIG. 4A, the dummy gate stack 224 covers portions (e.g., middle portions) of the nanosheet stacks 212, and reveals other portions of the nanosheet stacks 212, for example. Referring to FIG. 6, the portions of the nanosheet stacks 212 (with the spacer material 230 thereon) are removed and the underlying fins 203 are recessed to form recesses 234a, 234b. In other words, the portions of the nanosheet stacks 212 and the spacer material 230 thereon are entirely removed and portions of the fins 203 are further removed. The recesses 234a, 234b are referred to as "source/drain (S/D) recesses" in some examples. In some embodiments, the end portions of the nanosheet stacks 212 may be removed by an anisotropic etching process, an isotropic etching process, or a combination thereof. In some embodiments, top surfaces of the recesses 234a, 234b are lower than the top surfaces of the insulating regions 222. However, the disclosure is not limited thereto. In some embodiments, the spacer material 230 is partially removed during the recess forming operation, to form spacers 232 left standing over and aligned to the edges of insulating regions 222, with the recesses 234a, 234b formed therebetween, as shown in FIG. 6. In many embodiments, the method of forming the recesses 234a, 234b includes performing a suitable etching process, such as a dry etching process, a wet etching process, or an RIE process.

In some embodiments, the dielectric wall DW1 between the fins 203 is also partially removed during the recess forming operation, to lower the top surface of the dielectric wall DW1'. For example, the top surface of the dielectric wall DW1' between the fins 203 in FIG. 6 is lower than the top surface of the dielectric wall DW1 covered by the dummy gate stack 224 in FIG. 4B. In some embodiments, the top surface of the dielectric wall DW1' is substantially coplanar with top surfaces of the spacers 232. However, the disclosure is not limited thereto. The top surface of the dielectric wall DW1' may be higher than or lower than the top surfaces of the spacers 232.

Figure 7:
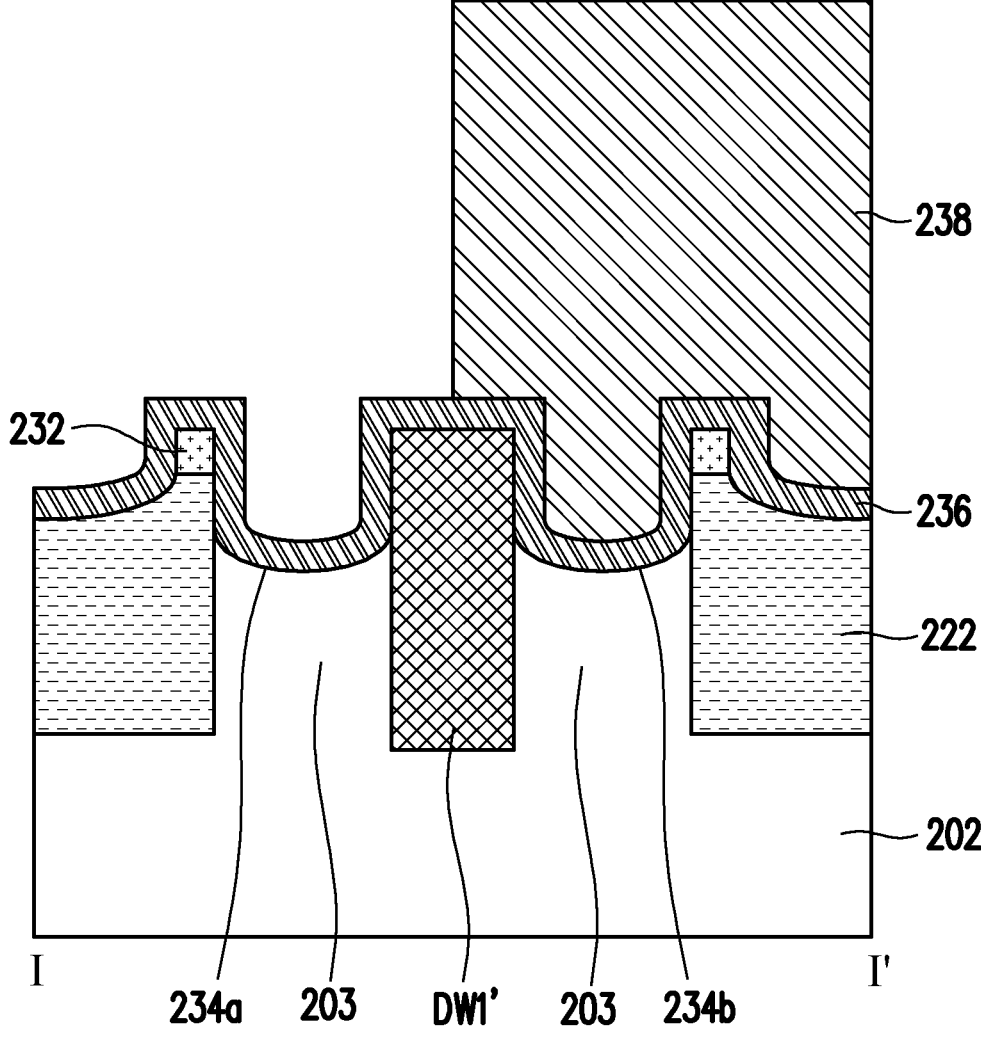
FIG. 7 illustrates a view of a part of a method of forming a semiconductor device in accordance with some embodiments.

Referring to FIG. 7, a dummy spacer layer 236 is formed on exposed surfaces of the spacers 232, the insulating regions 222, the recesses 234a, 234b and the dielectric wall DW1'. For example, the dummy spacer layer 236 is conformally formed on sidewalls and/or top surfaces of the spacers 232, the insulating regions 222, the recesses 234a, 234b and the dielectric wall DW1'. In some embodiments, the dummy spacer layer 236 includes a dielectric material, such as silicon oxide, silicon nitride, SiON, SiC, SiCN, SiCON, or a combination thereof. Other materials such as a low-k material may be applicable. The low-k material has a dielectric constant less than 3.9, less than 3, less than 2.5, or even less. Although the dummy spacer layer 236 illustrated in FIG. 7 has a single-layer structure, the embodiments of the present disclosure are not limited thereto. In other embodiments, the dummy spacer layer 236 has a multi-layer structure. For example, the dummy spacer layer 236 includes a silicon oxide layer and a silicon nitride material on the silicon oxide layer.

In some embodiments, then, a mask layer 238 is formed to cover one of the recesses (e.g., recess 234b) and a portion of the dielectric wall DW1'. For example, the mask layer 238 is formed on the dummy spacer layer 236 over the recess 234b and a portion of the dielectric wall DW1' immediately adjacent to the recess 234b. Accordingly, the other of the recesses (e.g., recess 234a) and the remaining portion of the dielectric wall DW1' are not covered by the mask layer 238, for example. The mask layer 238 may include a dielectric material, such as silicon oxide, silicon nitride, SiON, SiC, SiCN, SiCON, the like, or a combination thereof. Other materials such as a low-k material or a photoresist material may be applicable. The low-k material has a dielectric constant less than 3.9, less than 3, less than 2.5, or even less. The mask layer 238 is formed using CVD, LPCVD, PECVD, PVD, ALD, spin-coating, or a suitable process, followed by photolithography and etching processes. In some embodiments, the mask layer 238 covers the dummy spacer layer 236 on a portion of the dielectric wall DW1' and exposes the mask layer 238 on other portion of dielectric wall DW1'. However, the disclosure is not limited thereto. In alternative embodiments, the mask layer 238 exposes the dummy spacer layer 236 on the dielectric wall DW1' entirely or covers the dummy spacer layer 236 on the dielectric wall DW1' entirely.

Figure 8:
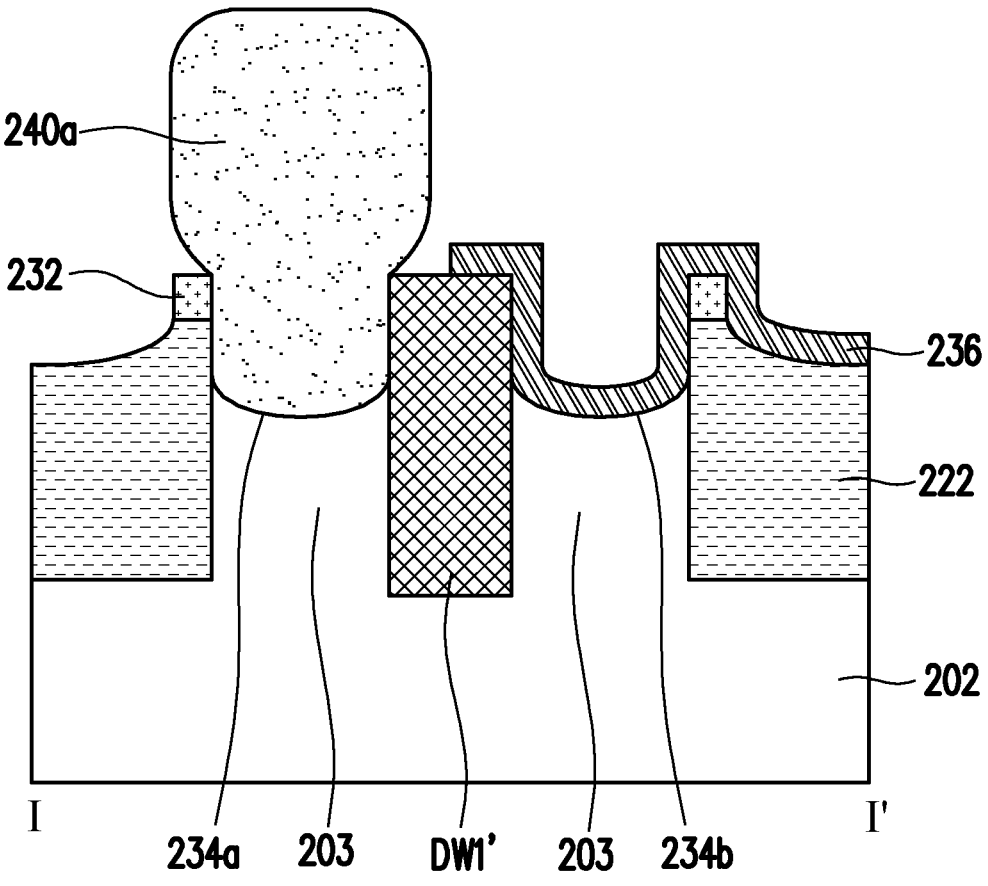
FIG. 8 illustrates a view of a part of a method of forming a semiconductor device in accordance with some embodiments.

Referring to FIG. 8, by using the mask layer 238 as a mask, the dummy spacer layer 236 is partially removed, to expose the recess (e.g., recess 234a). For example, the exposed dummy spacer layer 236 is entirely removed, to expose the recess 234a, a portion of the dielectric wall DW1', the spacer 232 and the insulating region 222. In some embodiments, the dummy spacer layer 236 is removed by an anisotropic etching process, an isotropic etching process, or a combination thereof. After partial removal of the dummy spacer layer 236, the mask layer 238 is removed by a suitable etching process, for example.

Then, a strained layer 240a is formed in the recess 234a. In some embodiments, the strained layer 240a is formed by an epitaxial growth process and is grown from the bottom of the recess 234a. For example, when the substrate 202 includes silicon, the strained layer 240a is a silicon-containing material. In alternative embodiments, before forming the strained layer 240a, a liner layer (not shown) beneficial for forming the strained layer 240a in the recess 234a is formed at the bottom of the recess 234a. In such embodiments, the liner layer improves a good interface for epitaxially growing the strained layer 240a.

Figure 9:
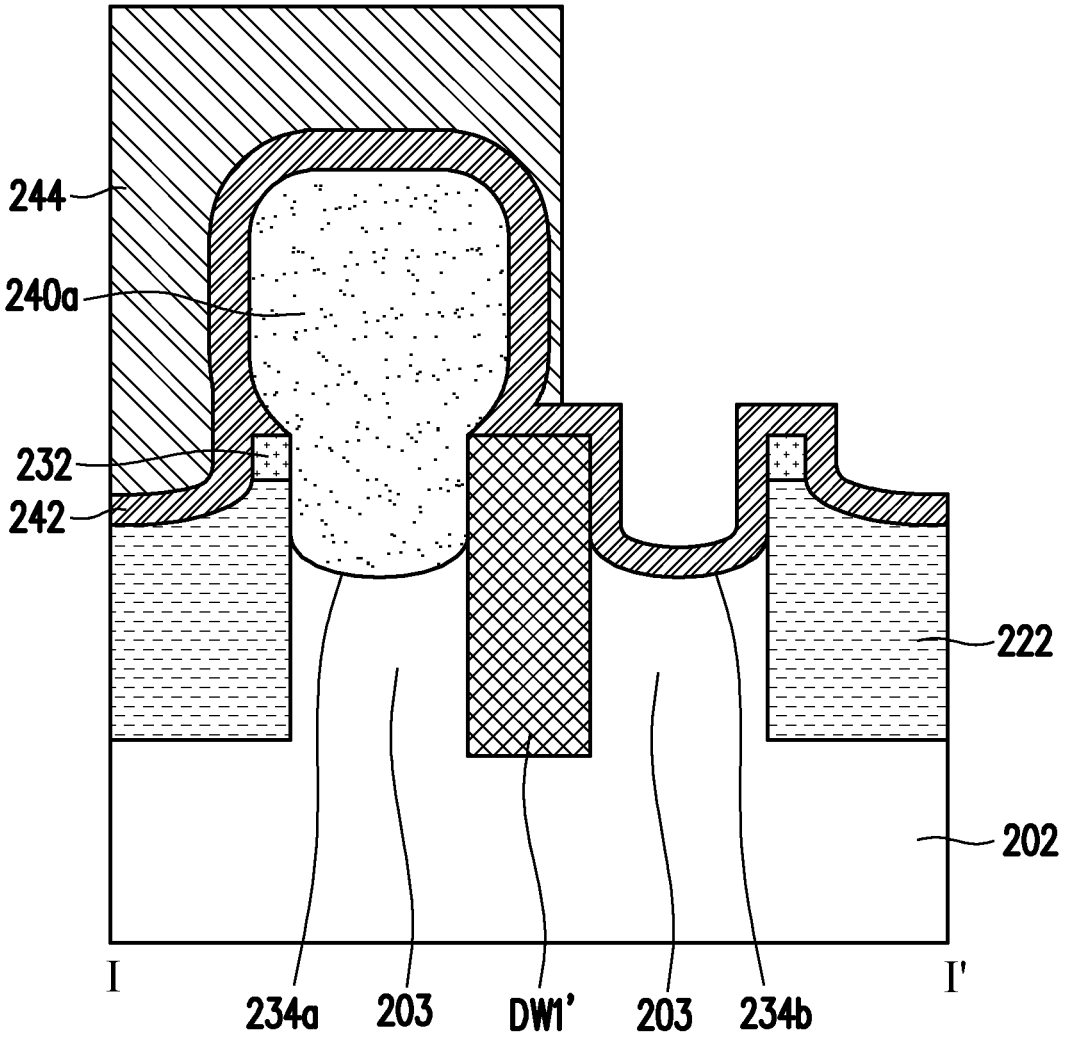
FIG. 9 illustrates a view of a part of a method of forming a semiconductor device in accordance with some embodiments.

Referring to FIG. 9, the remaining dummy spacer layer 236 is removed, and a dummy spacer layer 242 is formed on exposed surfaces of the strained layer 240a, the spacers 232, the insulating regions 222, the recess 234b and the dielectric wall DW1'. In some embodiments, the remaining dummy spacer layer 236 is removed by an anisotropic etching process, an isotropic etching process, or a combination thereof. After removal of the dummy spacer layer 236, the dummy spacer layer 242 is, for example, conformally formed on sidewalls and/or top surfaces of the strained layer 240a, the spacers 232, the insulating regions 222, the recess 234b and the dielectric wall DW1'. In some embodiments, an air gap between the strained layer 240a and the dielectric wall DW1' may be filled by the dummy spacer layer 242. However, the disclosure is not limited thereto. In alternative embodiments (not shown), the air gap remains after the formation of the dummy spacer layer 242. In some embodiments, the dummy spacer layer 242 includes a dielectric material, such as silicon oxide, silicon nitride, SiON, SiC, SiCN, SiCON, or a combination thereof. Other materials such as a low-k material may be applicable. The low-k material has a dielectric constant less than 3.9, less than 3, less than 2.5, or even less. Although the dummy spacer layer 242 illustrated in FIG. 9 has a single-layer structure, the embodiments of the present disclosure are not limited thereto. In other embodiments, the dummy spacer layer 242 has a multi-layer structure. For example, the dummy spacer layer 242 includes a silicon oxide layer and a silicon nitride material on the silicon oxide layer. The material of the dummy spacer layer 242 may be substantially the same as or different from the material of the dummy spacer layer 236. The material of the dummy spacer layer 242 may be substantially the same as or different from the material of the dielectric wall DW1'.

Then, a mask layer 244 is formed to cover the strained layer 240a and exposes the dummy spacer layer 242 on the recess 234b. For example, the mask layer 244 is formed on the strained layer 240a and a portion of the dielectric wall DW1' immediately adjacent to the strained layer 240a. The mask layer 244 may include a dielectric material, such as silicon oxide, silicon nitride, SION, SiC, SiCN, SiCON, the like, or a combination thereof. Other materials such as a low-k material or a photoresist material may be applicable. The low-k material has a dielectric constant less than 3.9, less than 3, less than 2.5, or even less. The mask layer 244 is formed using CVD, LPCVD, PECVD, PVD, ALD, spin-coating, or a suitable process, followed by photolithography and etching processes. In some embodiments, the mask layer 244 covers a portion of the dielectric wall DW1'. However, the disclosure is not limited thereto. In alternative embodiments, the mask layer 244 covers the dielectric wall DW1' entirely. For example, the dummy spacer layer 242 on the dielectric wall DW1' is entirely covered by the mask layer 244.

Figure 10:
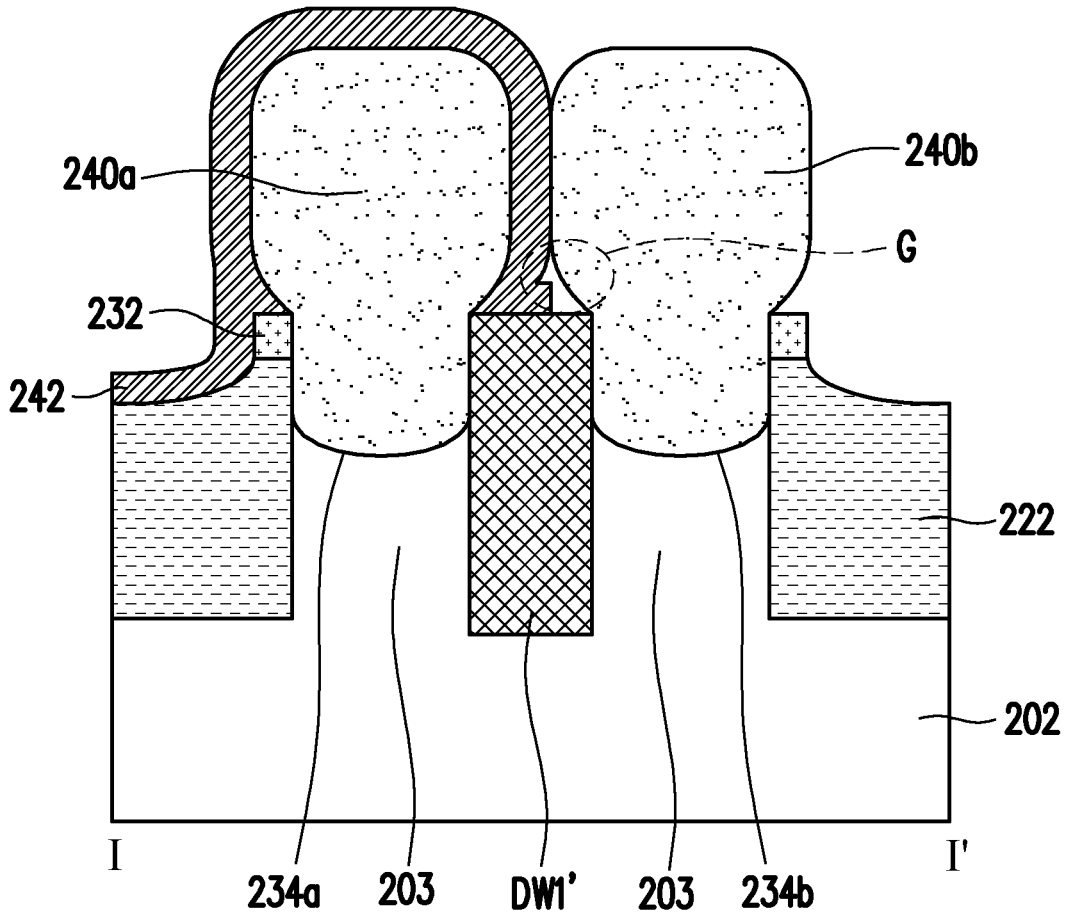
FIG. 10 illustrates a view of a part of a method of forming a semiconductor device in accordance with some embodiments.

Referring to FIG. 10, by using the mask layer 244 as a mask, the dummy spacer layer 242 is partially removed, to expose the recess 234b. For example, the exposed dummy spacer layer 242 is entirely removed, to expose the recess 234$b$, a portion of the dielectric wall DW1', the spacer 232 and the insulating region 222. In some embodiments, the dummy spacer layer 242 is removed by an anisotropic etching process, an isotropic etching process, or a combination thereof. After partial removal of the dummy spacer layer 242, the mask layer 244 is removed by a suitable etching process, for example.

Then, a strained layer 240$b$ is formed in the recess 234$b$. In some embodiments, the strained layer 240$b$ is formed by an epitaxial growth process and is grown from the bottom of the recess 234$b$. For example, when the substrate 202 includes silicon, the strained layer 240$b$ is a silicon-containing material. In alternative embodiments, before forming the strained layer 240$b$, a liner layer (not shown) beneficial for forming the strained layer 240$b$ in the recess 234$b$ is formed at the bottom of the recess 234$b$. In such embodiments, the liner layer improves a good interface for epitaxially growing the strained layer 240$b$. In some embodiments, as shown in FIG. 10, an air gap G is formed between the strained layer 240$b$ and the dummy spacer layer 242.

Figure 14A:
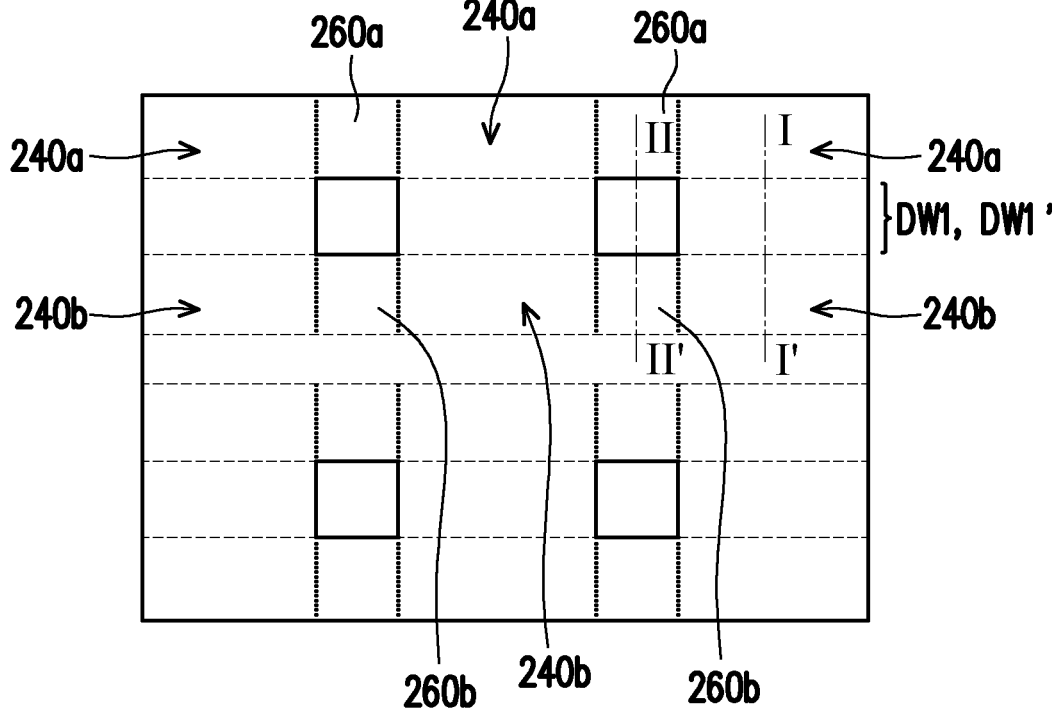
FIG. 14A illustrates a view of a part of a method of forming a semiconductor device in accordance with some embodiments.
Figure 14B:
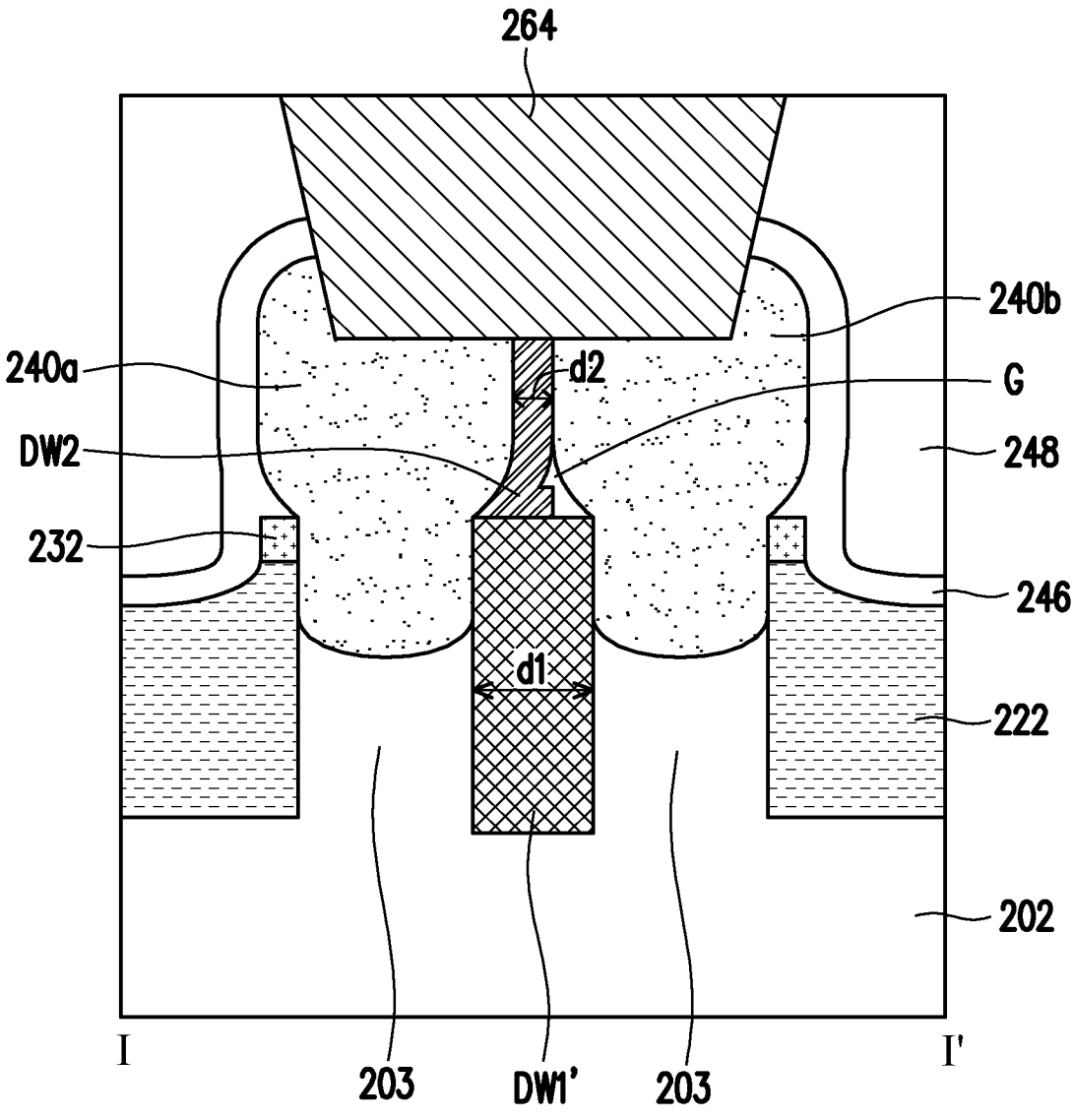
FIG. 14B illustrates a view of a part of a method of forming a semiconductor device in accordance with some embodiments.
Figure 14C:
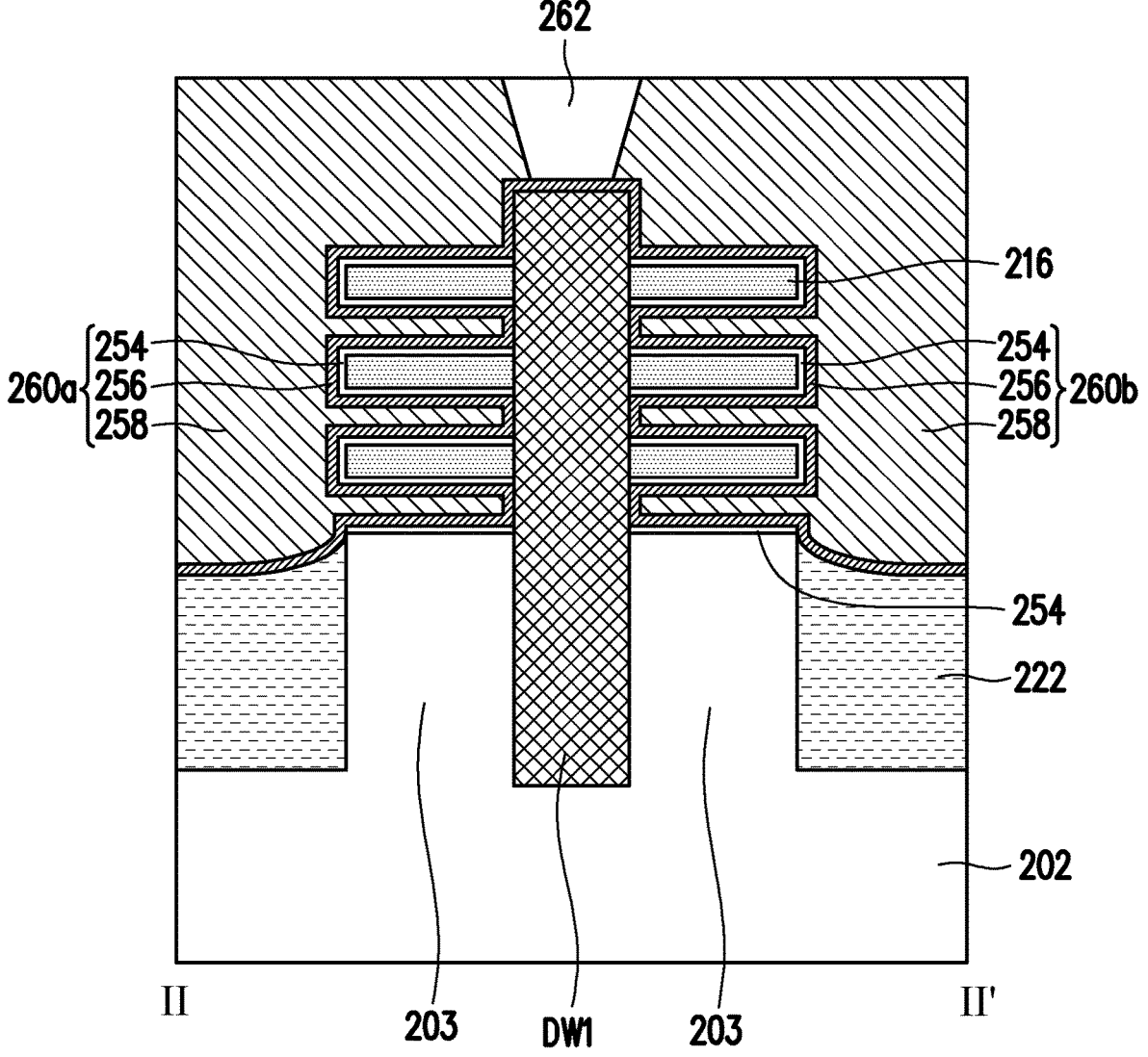
FIG. 14C illustrates a view of a part of a method of forming a semiconductor device in accordance with some embodiments.

In some embodiments, the strained layers 240$a$, 240$b$ are used to strain or stress the second nanosheets (which may be referred to as channel members) 216 and the fins 203. Herein, the strained layers may be referred to as "epitaxial layers", "S/D regions" or "highly doped low resistance materials" in some examples. In some embodiments, the strained layers 240$a$, 240$b$ include source regions and drain regions. The strained layers 240$a$, 240$b$ are disposed on the fins 203 and abutted the nanosheet stacks 212, as shown in FIG. 14A to FIG. 14C. In some embodiments, the strained layers 240$a$, 240$b$ extend beyond the top surfaces of the nanosheet stacks 212. However, the embodiments of the present disclosure are not limited thereto, in other embodiments, the top surfaces of the strained layers 240$a$, 240$b$ are substantially flushed with the top surfaces of the nanosheet stacks 212.

In some embodiments, the strained layers 240$a$, 240$b$ are doped with a conductive dopant. For example, the strained layer 240$a$ is epitaxial-grown with an n-type dopant for straining an n-type device. That is, the strained layer 240$a$ is doped with the n-type dopant to be the source or the drain of the n-type device. The n-type dopant includes arsenic and/or phosphorus, and the strained layer 240$a$ may be epitaxial-grown by LPCVD process with in-situ doping. Similarly, the strained layer 240$b$ may be epitaxial-grown with a p-type dopant for straining a p-type device. That is, the strained layer 240$b$ is doped with the p-type dopant to be the source or the drain of the p-type device. The p-type dopant includes boron or $BF_2$, and the strained layer 240$b$ may be epitaxial-grown by LPCVD process with in-situ doping. However, the disclosure is not limited thereto. In alternative embodiments, the strained layers 240$a$, 240$b$ may have the same conductive type. For example, the strained layers 240$a$, 240$b$ are both of n-type or p-type.

Figure 11:
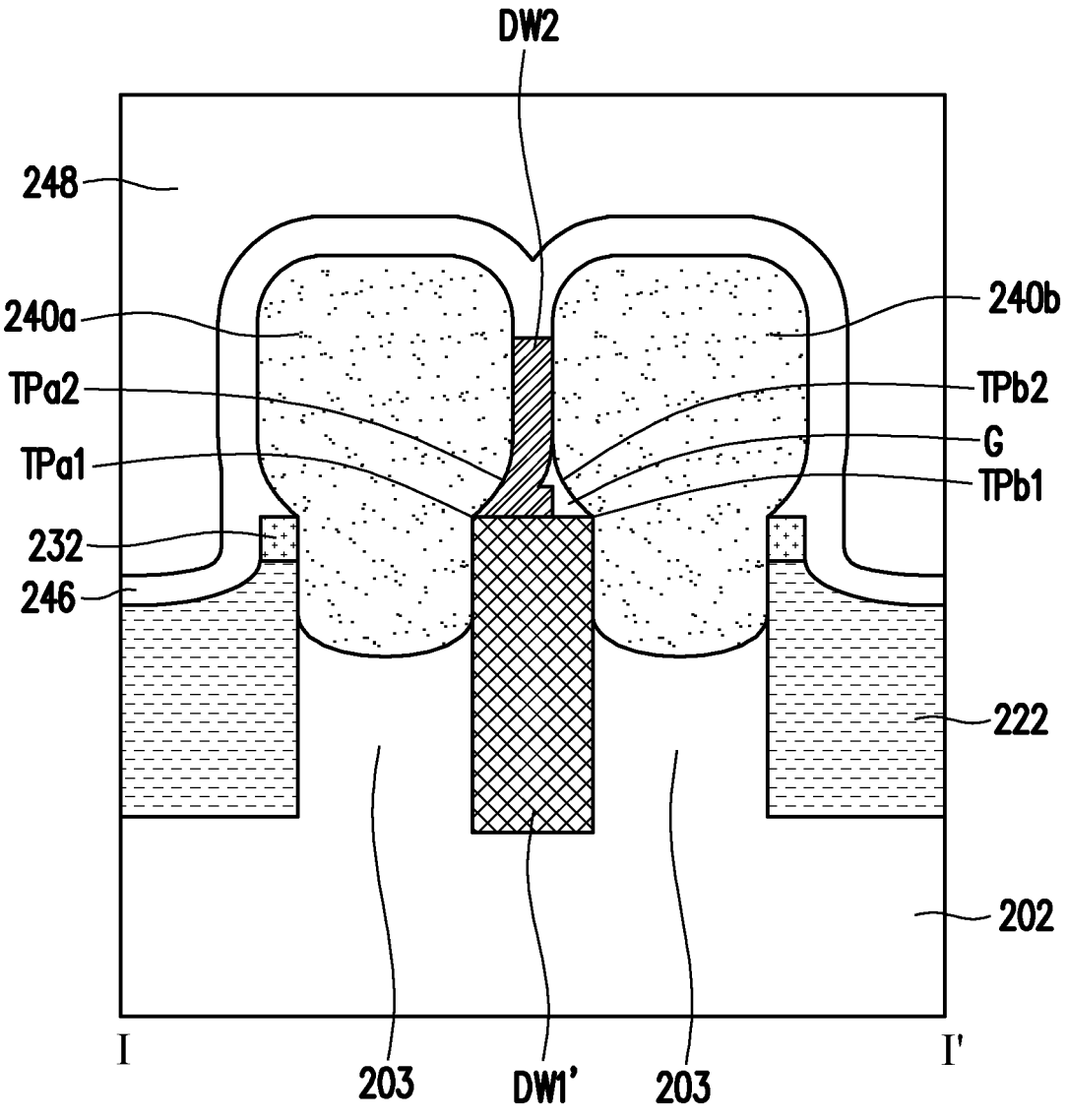
FIG. 11 illustrates a view of a part of a method of forming a semiconductor device in accordance with some embodiments.

Referring to FIG. 11, the exposed dummy spacer layer 242 is removed, and the remaining dummy spacer layer 242 forms a dielectric wall DW2 between the strained layer 240$a$ and the strained layer 240$b$. In some embodiments, as shown in FIG. 10 and FIG. 11, the dummy spacer layer 242 on the top surface and the exposed sidewall of the strained layer 240$a$ are removed while the dummy spacer layer 242 between the strained layer 240$a$ and the strained layer 240$b$ is remained. In some embodiments, the dielectric wall DW2 is disposed on the dielectric wall DW1', and a top surface of the dielectric wall DW2 is not higher than the top surface of at least one of the strained layers 240$a$ and 240$b$. For example, the top surface of the dielectric wall DW2 is lower than or substantially coplanar with both the top surfaces of the strained layers 240$a$ and 240$b$. In an embodiment in which the material of the dielectric wall DW2 is the same as the material of the dielectric wall DW1', an interface may not exist between the dielectric wall DW2 and the dielectric wall DW1'. However, the disclosure is not limited thereto. Since the dielectric wall DW2 and the dielectric wall DW1' are formed separately, an interface may be formed therebetween even if the dielectric wall DW2 and the dielectric wall DW1' have substantially the same material. In an embodiment in which the materials of the dielectric wall DW2 and the dielectric wall DW1' are different, the interface exists the dielectric wall DW2 and the dielectric wall DW1'. As shown in FIG. 14B, a horizontal dimension d2 (e.g., width or thickness) of the dielectric wall DW2 is, for example, smaller than the horizontal dimension d1 (e.g., width) of the dielectric wall DW1'. The dielectric wall DW2 may have a thickness in a range of 2 nm to 10 nm. In some embodiments, the dielectric wall DW2 is also referred to as a post-epitaxial dielectric wall since the dielectric wall DW2 is formed after the formation of the first epitaxial growth process (e.g., the formation of the strained layer 240$a$). The first epitaxial growth process may be an n-type epitaxial growth process or p-type epitaxial growth process, and thus the dielectric wall DW2 may be formed after n-type epitaxial growth process or p-type epitaxial growth process. In some embodiments, the dielectric wall DW1' and the dielectric wall DW2 are also collectively referred to as a dielectric wall or a dielectric wall structure.

Then, a contact etch stop layer (CESL) 246 is formed over the exposed strained layers 240$a$ and 240$b$ and the dielectric wall DW2. In some embodiments, the CESL 246 conformally covers the upper portions of the strained layers 240$a$ and 240$b$, the top surface of the dielectric wall DW2, and the sidewall and the top surface of the spacers 232. The CESL 246 may include silicon nitride, silicon oxynitride, silicon nitride with oxygen (O) or carbon (C) elements, metal oxide such as $Al_2O_3$, the like, or a combination thereof, and may be formed by CVD, PVD, ALD, or a suitable process. In some embodiments, the CESL 246 fills gaps between the spacers 232 and the strained layers 240$a$, 240$b$. However, the disclosure is not limited thereto. In alternative embodiments, the gaps may remain between the formed CESL 246 and the strained layers 240$a$, 240$b$ after the formation of the CESL 246.

Thereafter, an interlayer dielectric (ILD) layer 248 is formed over the CESL 246. In some embodiments, the ILD layer 248 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, the like, or a combination thereof. In some other embodiments, the ILD layer 248 includes a low-k material. The low-k material has a dielectric constant less than 3.9, less than 3, less than 2.5, or even less. Examples of the low-k material include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), the like, or a combination thereof. In some embodiments, the ILD layer 248 has a single-layer structure or a multi-layer structure. In some embodiments, the ILD layer 248 is formed by FCVD, CVD, HDPCVD, SACVD, spin-on process, sputtering, or a suitable process.

Figure 16A:
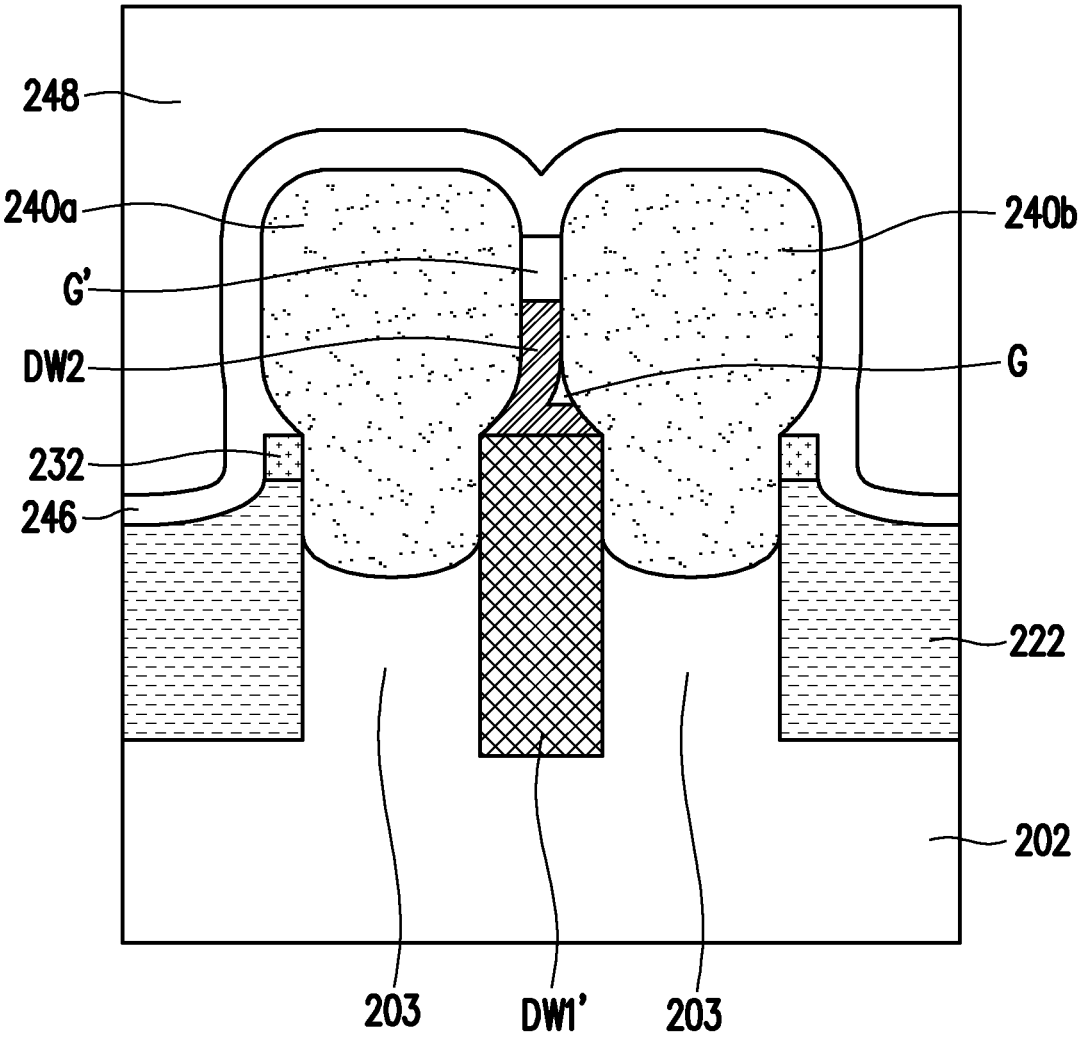
FIG. 16A and FIG. 16B illustrate cross-sectional views of a semiconductor device in accordance with some embodiments.
Figure 16B:
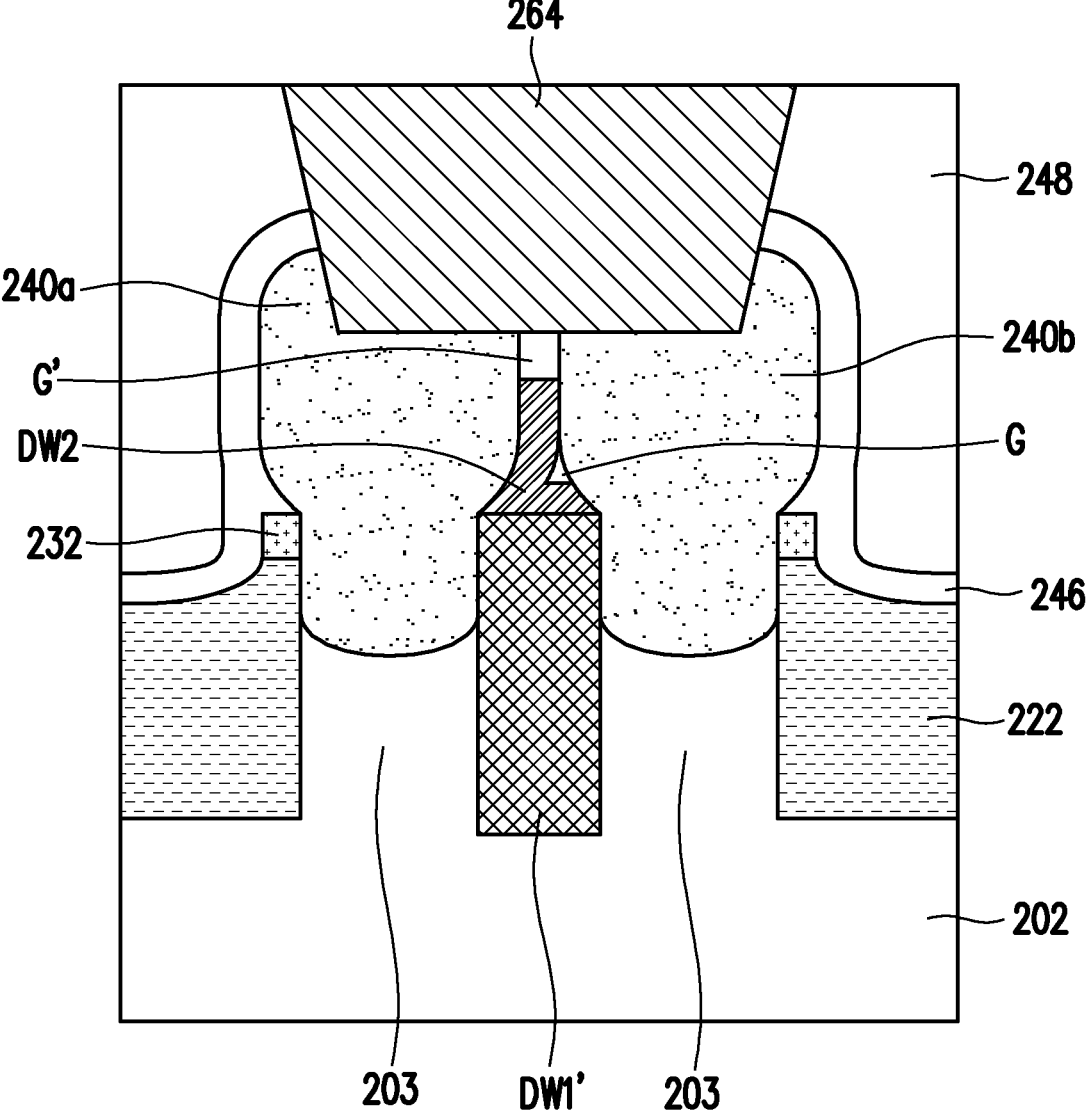

In some embodiments, as shown in FIG. 11, adjacent strained layers 240$a$, 240$b$ are separated from each other by the dielectric walls DW1' and DW2 therebetween. In other words, the strained layers 240a, 240b are disposed at opposite sides of the dielectric walls DW1' and DW2. For example, the strained layer 240a is disposed at a first side of the dielectric walls DW1' and DW2, and the strained layer 240b is disposed at a second side opposite to the first side of the dielectric walls DW1' and DW2. In some embodiments, as a result of the epitaxial-grown process used to form the strained layers 240a, 240b, the cross-sectional views of the strained layers 240a, 240b have a bulb-like shape, and portions of the sidewalls of the strained layers 240a, 240b are conformal to and in contact with the dielectric walls DW1' and DW2. For example, the cross-sectional views of the strained layers 240a, 240b have turning points TPa1, TPa2, TPb1, TPb2. The turning point TPa1, TPb1 is disposed at a top corner of the dielectric wall DW1', for example. The turning point TPa2, TPb2 is disposed between the turning point TPa1, TPb1 and a top surface of the strained layer 240a, 240b, for example. Specifically, the turning point TPa2, TPb2 is, for example, disposed at a position between a curved sidewall and a substantially vertical sidewall of the strained layer 240a, 240b. In some embodiments, as shown in FIG. 10 and FIG. 11, after formation of the strained layer 240b, the air gap G remains between the dielectric wall DW2 and the strained layer 240b. For example, the air gap G is located at a position between the dielectric wall DW2 on the turning point TPa2 of the strained layer 240a and the turning point TPb2 of the strained layer 240b. In some embodiments, the air gap G is further located between a portion of the dielectric wall DW2 on the top surface of the dielectric wall DW1' and the turning point TPb1 of the strained layer 240b. In alternative embodiments, the mask layer 244 in FIG. 10 covers the dummy spacer layer 242 on the dielectric layer DW1' entirely, and as a result, the formed dielectric wall DW2 covers the top surface of the dielectric layer DW1' entirely. In such embodiments, the strained layer 240b is grown to be in contact with the dummy spacer layer 242 (i.e., dielectric wall DW2), and thus the air gap G does not exist between the dielectric wall DW2 and the turning point TPb1 of the strained layer 240b, as shown in FIG. 16A and FIG. 16B. In alternative embodiments, the strained layers 240a, 240b have a diamond-like shape or a polygonal shape (e.g., a pentagonal shape, a hexagonal shape, etc.).

Figure 12:
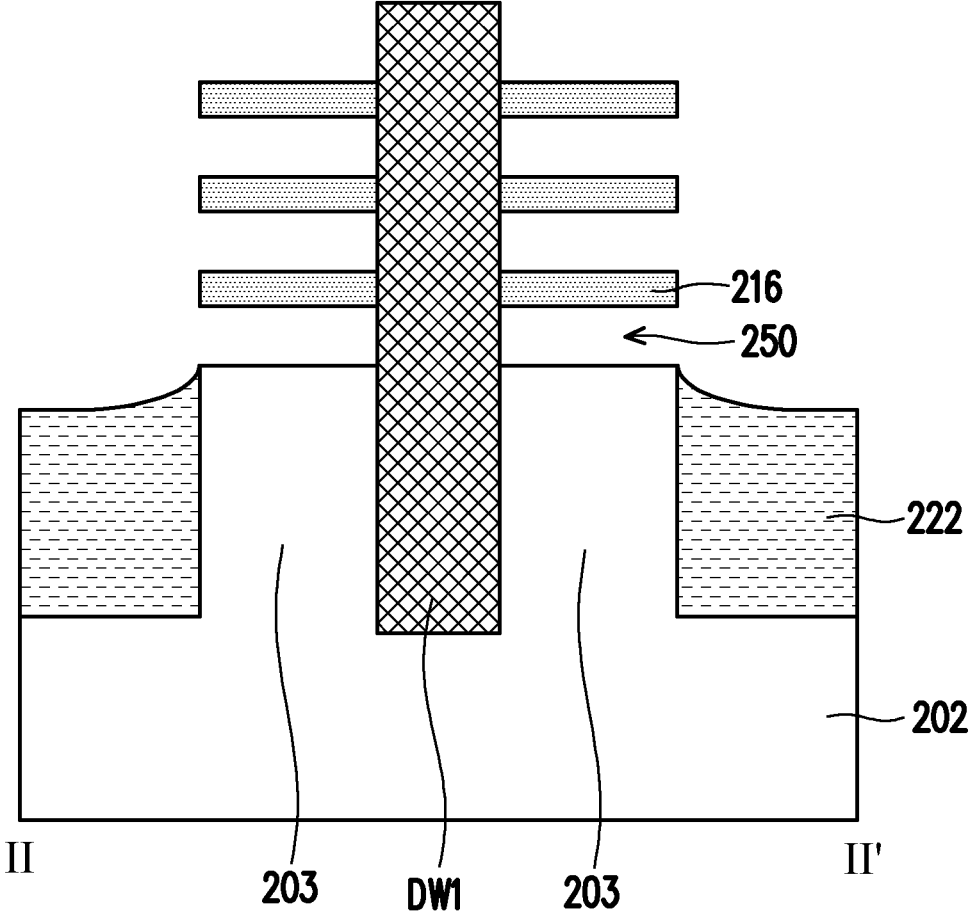
FIG. 12 illustrates a view of a part of a method of forming a semiconductor device in accordance with some embodiments.
Figure 13:
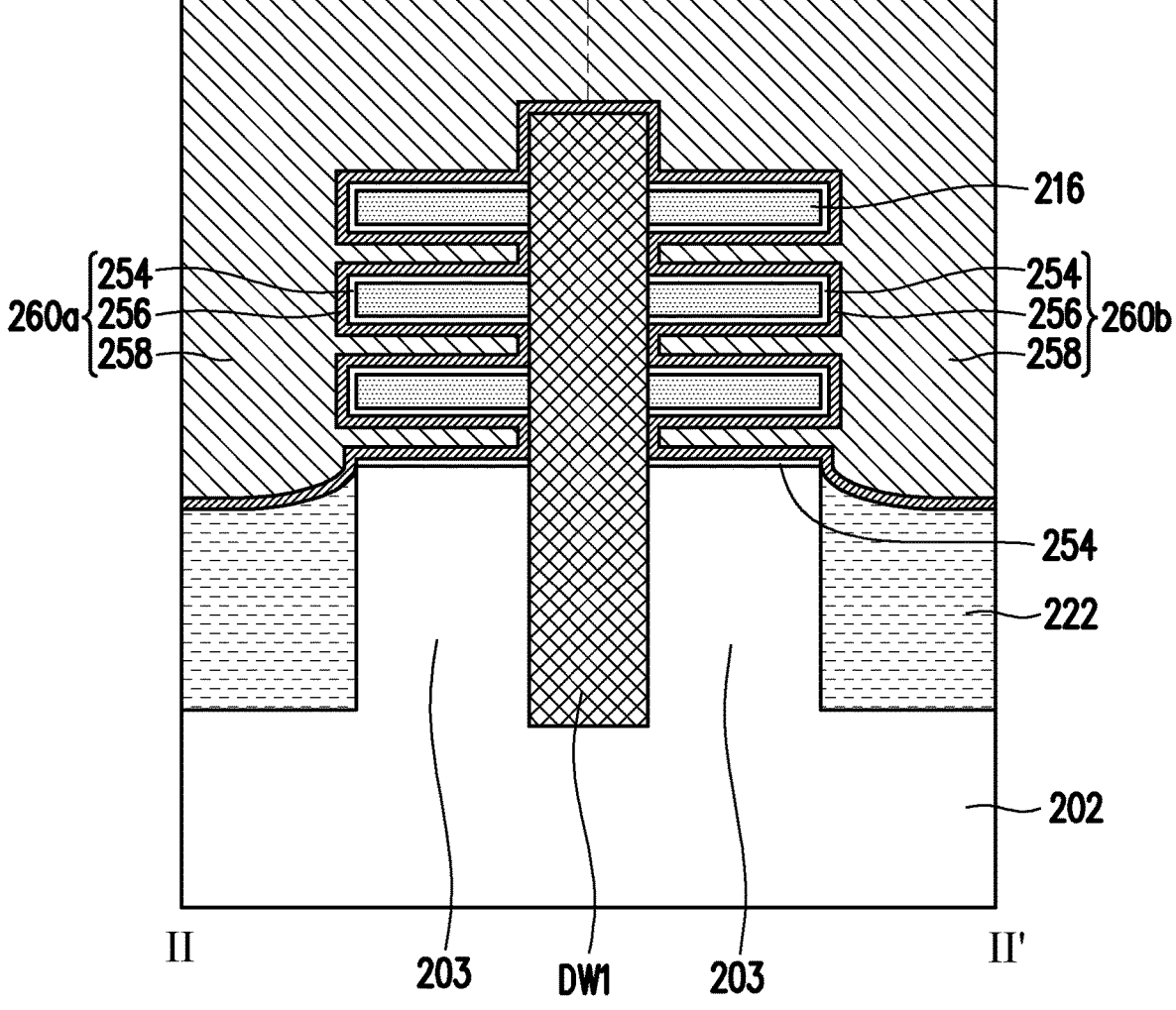
FIG. 13 illustrates a view of a part of a method of forming a semiconductor device in accordance with some embodiments.

FIG. 12 and FIG. 13 illustrate cross-sectional views taken along lines II-II' of FIG. 4A. Referring to FIG. 4B and FIG. 12, after formation of the strained layers 240a, 240b and the dielectric wall DW2 as described above, the dummy gate stack 224 (including the dummy gate electrode layer 228 and the dummy gate dielectric layer 226) is removed, and channel members (or called channel regions) are defined for the semiconductor device. The ILD layer 248 and the CESL layer 246 protect the stained layers 240a, 240b as shown in FIG. 11 during the removal of the dummy gate stack 224. The dummy gate stack 224 may be removed using plasma dry etching and/or wet etching. When the dummy gate electrode layer 228 is polysilicon and the ILD layer 248 is silicon oxide, a wet etchant such as a TMAH solution may be used to selectively remove the dummy gate electrode layer. The dummy gate dielectric layer 226 is then removed using plasma dry etching and/or wet etching.

In some embodiments, an etching process is performed to remove the first nanosheets 214. In the case, the first nanosheets 214 may be completely removed to form gaps 250 between the second nanosheets 216, as shown in FIG. 12. Accordingly, the second nanosheets 216 are separated from each other by the gaps 250. In addition, the bottommost second nanosheet 216 may also be separated from the fin 203 by the gaps 250. As a result, the second nanosheets 216 are suspended. In some embodiments, the suspended second nanosheets 216 may be referred to as "channel members" or "channel regions". As shown in FIG. 12, the second nanosheets 216 separated from each and vertically stacked are referred to as a "stack of semiconductor nanosheets" or "stack of semiconductor channels" in some examples.

In some embodiments, a height of the gaps 250 may be about 5 nm to 30 nm. In the present embodiment, the second nanosheets 216 include silicon, and the first nanosheets 214 include silicon germanium. The first nanosheets 214 may be selectively removed by oxidizing the first nanosheets 214 using a suitable oxidizer, such as ozone. Thereafter, the oxidized first nanosheets 214 may be selectively removed. In some embodiments, the etching process includes a dry etching process to selectively remove the first nanosheets 214, for example, by applying an HCl gas at a temperature of about 20° C. to about 300° C., or applying a gas mixture of $CF_4$, $SF_6$, and $CHF_3$. As shown in FIG. 12, after removal of the first nanosheets 214, the top surface of the dielectric wall DW1 is higher than the topmost second nanosheet 216.

Referring to FIG. 12 and FIG. 13, a gate dielectric layer 256 is formed on the exposed surfaces of the second nanosheets 216 and the dielectric wall DW1. In some embodiments, the gate dielectric layer 256 conformally covers the exposed surfaces of the second nanosheets 216 and the dielectric wall DW1 and thus wraps around the second nanosheets 216 in the channel regions. In some embodiments, the gate dielectric layer 256 includes at least one dielectric material, such as a high-k material. Examples of the high-k material include metal oxide, such as HfO2, HfSiO, HfSiON, HfTaO, HfTiO, HfZrO, zirconium oxide, aluminum oxide, titanium oxide, hafnium dioxide-alumina ($HfO_2$—$Al_2O_3$) alloy, the like, or combinations thereof. The high-k material has a dielectric constant less than 8, less than 15, less than 20, or even more. The gate dielectric layer 256 may be formed by CVD, ALD or a suitable method. In one embodiment, the gate dielectric layer 256 is formed by using a highly conformal deposition process, such as ALD in order to ensure the formation of a gate dielectric layer having a uniform thickness around each channel members. The thickness of the gate dielectric layer 256 is in a range from about 0.5 nm to about 3 nm in some embodiments.

In some embodiments, as shown in FIG. 13, an interfacial layer 254 is further formed between each channel members (e.g., nanosheet 216) and the gate dielectric layer 256 (e.g., high k material). For example, the interfacial layer 254 wraps each of the second nanosheets 216 in the channel regions. The interfacial layer 254 may be deposited or thermally grown respectively on the second nanosheets 216 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The interfacial layer 254 may be further formed on the exposed top surface of the substrate 202, as shown in FIG. 13. The thickness of the interfacial layer 254 is in a range from about 0.7 nm to about 2.5 nm in some embodiments. In alternative embodiments, the interfacial layer and the high k material are collectively referred to as the gate dielectric layer. In some embodiments, as shown in FIG. 13, after formation of the interfacial layer 254 and the gate dielectric layer 256, the gaps 250 remain between the second nanosheets 216. In alternative embodiments, the gaps 250 are entirely or partially filled by the gate dielectric layer 256.

Thereafter, a gate electrode 258 is formed on the gate dielectric layer 256 to surround each of the second nanosheets 216. For example, the gate electrode 258 wraps around the second nanosheets 216 in the channel regions with the gate dielectric layer 256 therebetween. In some embodiments, the gate electrode 258 completely fills the gaps 250. In some embodiments, the gate electrode 258 includes one or more conductive materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloy, a suitable material, or a combination thereof. The gate electrode 258 may be formed by CVD, ALD, electroplating, or other suitable method. The gate dielectric layer 256 and the gate electrode 258 may also be deposited over the upper surfaces of the ILD layer 248 and the CESL layer 246. In such embodiments, the gate dielectric layer 256 and the gate electrode 258 formed over the ILD layer 248 and the CESL layer 246 are then planarized by using, for example, CMP, until the top surfaces of the ILD layer 248 and the CESL layer 246 are revealed. After the planarization operation, the gate electrode 258 is recessed and a cap insulating layer (not shown) is formed over the recessed gate electrode 258. The cap insulating layer includes one or more layers of a silicon nitride-based material, such as SiN. The cap insulating layer may be formed by depositing an insulating material followed by a planarization operation.

In other embodiments, one or more work function adjustment layers (not shown) are interposed between the gate dielectric layer 256 and the gate electrode 258. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-type device, one or more of TaN, TaAlC, TIN, TIC, Co, TiAl, HfTi, TiSi and TaSi is used as the work function adjustment layer, and for the p-type device, one or more of TiAlC, Al, TiAl, TaN, TaAlC, TIN, TiC and Co is used as the work function adjustment layer. The work function adjustment layer may be formed by ALD, PVD, CVD, e-beam evaporation, or other suitable process. Further, the work function adjustment layer may be formed separately for the n-type device and the p-type device which may use different metal layers. In some embodiments, the gate electrode 258 and the gate dielectric layer 256 constitute a gate structure 260a, 260b. Specifically, as shown in FIG. 13, the gate structure 260a wraps the nanosheets 216 at a first side of the dielectric wall DW1, and the gate structure 260b wraps the nanosheets 216 at a second side opposite to the first side of the dielectric wall DW1.

FIG. 14A to FIG. 14C illustrate varying views of stages of forming a semiconductor device. FIG. 14A illustrates a top view of a stage of forming a semiconductor device. FIG. 14B illustrates a cross-sectional view taken along a line I-I' of FIG. 14A. FIG. 14C illustrates a cross-sectional view taken along a line II-II' of FIG. 14A. Referring to FIG. 14A and FIG. 14B, a contact 264 is formed in the ILD layer 248 for the connection of the strained layers 240a, 240b. In some embodiments, the contact 264 is formed by penetrating the ILD layer 248 and the CESL 246, to be in direct contact with the strained layers 240a, 240b. In some embodiments, the contact 264 is in form of a line crossing the dielectric wall DW1' therebelow. In alternative embodiments, the contact 264 is in form of a via on the strained layer 240a, 240b. In some embodiments, the contact 264 is in direct contact with the top surfaces of the dielectric wall DW2 and the stained layers 240a, 240b. In alternative embodiments, an interlayer dielectric (ILD) layer (not shown) is further formed over the ILD layer 248 and the CESL 246, and the contact 264 penetrates the ILD layer, the ILD layer 248 and the CESL 246.

Figure 15:
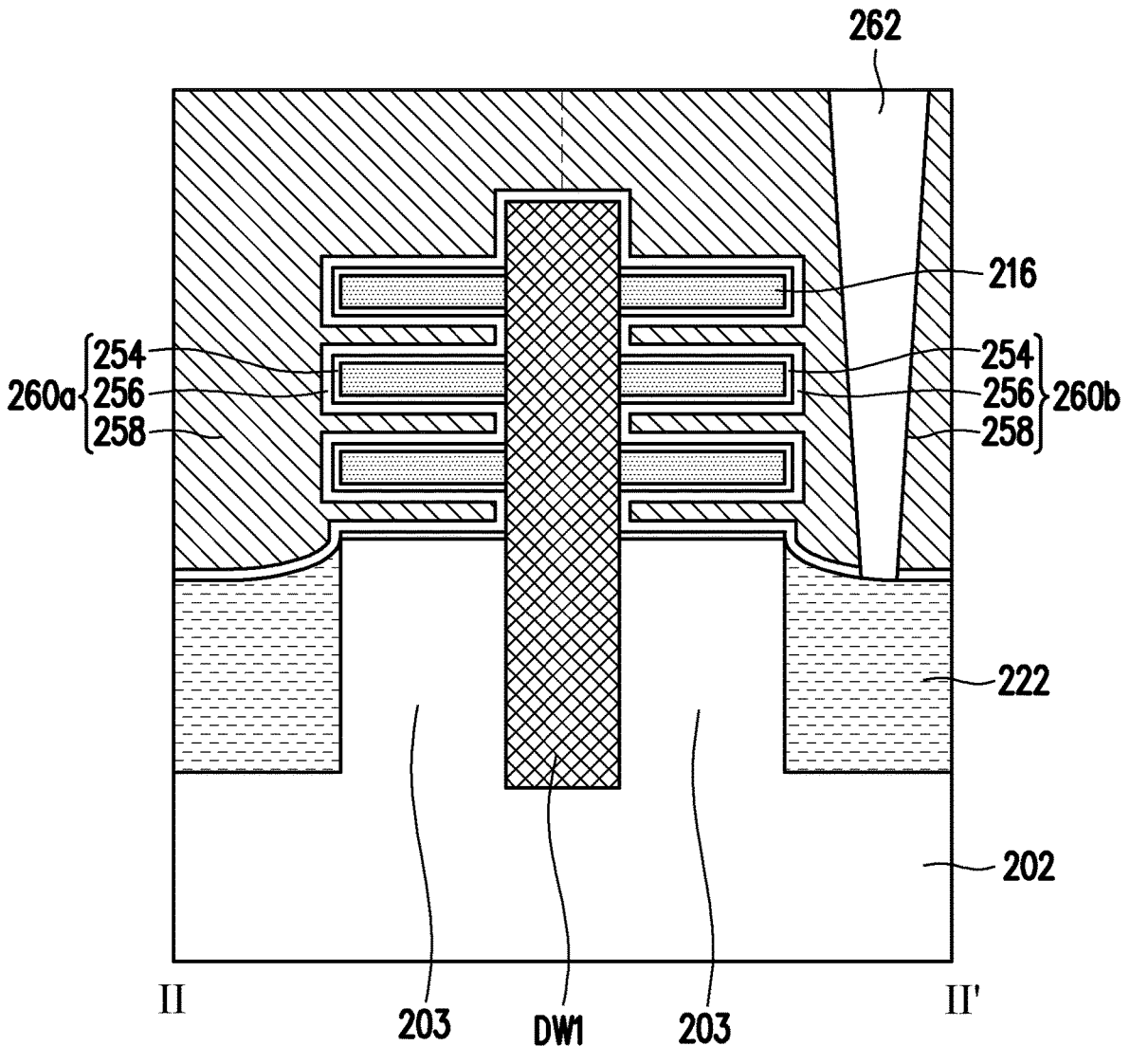
FIG. 15 illustrates a view of a cross-sectional view of a semiconductor device in accordance with some embodiments.

In some embodiments, as shown in FIG. 14C, at a specific location, a cut gate structure 262 is formed between the gate structures 260a, 260b to separate the adjacent gate structures 260a, 260b. The material of the cut gate structures 262 may include silicon oxide, silicon nitride, silicon oxynitride, a spin-on dielectric material, or a low-k material. The cut gate structures 262 are referred to as "isolation strips", "shallow trench isolation (STI) regions" or "deep trench isolation (DTI) regions" in some examples. The cut gate structure 262 may be formed at any suitable position. For example, as shown in FIG. 15, the cut gate structure 262 is disposed at another location, to separate the adjacent gate structures 260a, 260b. In such embodiments, the cut gate structure 262 includes a continuously extending vertical segment parallel to the dielectric wall DW1.

Upon the formation of the gate structures 260a, 260b, a semiconductor device of the embodiment is thus accomplished. In some embodiments, the semiconductor device is a forksheet device. In some embodiments, the dielectric wall DW1 provides the isolation between the adjacent gate structures 260. In addition, the dielectric walls DW1' and DW2 are disposed between two adjacent strained layers 240a and 240b, to prevent the undesired bridge or connection of the strained layers 240a and 240b and provide the isolation between the strained layers 240a and 240b. In addition, as shown in FIG. 8 and FIG. 10, since the top surface of the dielectric wall DW1' is lowered (e.g., the top surface of the dielectric wall DW1' is substantially coplanar with the top surface of the spacer 232), the formation of the stained layers 240a, 240b may be not substantially confined by the sidewall of the dielectric wall DW1'. For example, the upper portions of the stained layers 240a, 240b are not confined by the sidewall of the dielectric wall DW1'. In addition, the formation of the upper portion of the strained layer 240b may be confined by the dummy spacer layer 242 as shown in FIG. 10. However, since the thickness of the dummy spacer layer 242 may be much thinner than the dielectric wall DW1', the dummy spacer layer 242 does not affect the formation of the strained layer 240b substantially. Accordingly, the critical dimension of the upper portions of the stained layers 240a, 240b may be larger. Thus, the contact resistance between the contact 264 and the stained layers 240a, 240b is reduced. In addition, the contact 264 lands on the stained layers 240a, 240b easily without the hindrance of the dielectric wall protruded between the stained layers 240a, 240b, for example. In some embodiments, although the dielectric wall DW1' is lowered, the dummy spacer layer 242 provides the isolation from the stained layer 240a during the formation of the stained layer 240b, and the dielectric wall DW2 formed form the dummy spacer layer 242 provides the isolation for the formed stained layers 240a, 240b.

In some embodiments, the dielectric wall DW2 is in direct contact with the stained layers 240a, 240b and the dielectric wall DW1'. As shown in FIG. 14B, a bottom surface of the dielectric wall DW2 is higher than bottom surfaces of the stained layers 240a, 240b. The dielectric wall DW1' is in direct contact with and interposed between lower sidewalls of the stained layers 240a, 240b, and the dielectric wall DW2 is in direct contact with and interposed between upper sidewalls of the stained layers 240a, 240b. In some embodiments, as mentioned before, the air gap G exists between the dielectric wall DW2 and the strained layer 240b, and thus the contact area between the strained layer 240a and the dielectric wall DW2 is different from (e.g., less than) the contact area the strained layer 240a and the dielectric wall DW2.

The above embodiments of the configuration of the dielectric wall DW2 are provided for illustration purposes, and are not construed as limiting the present disclosure. The configuration in cross-section views of the dielectric wall DW2 may be modified upon the customer requirements. Specifically, the cross-sectional views in FIG. 16B, FIG. 17, FIG. 18 and FIG. 19B can be applied to the semiconductor device. Various configurations in cross-section views of the dielectric walls DW2 are described in details below.

Figure 17:
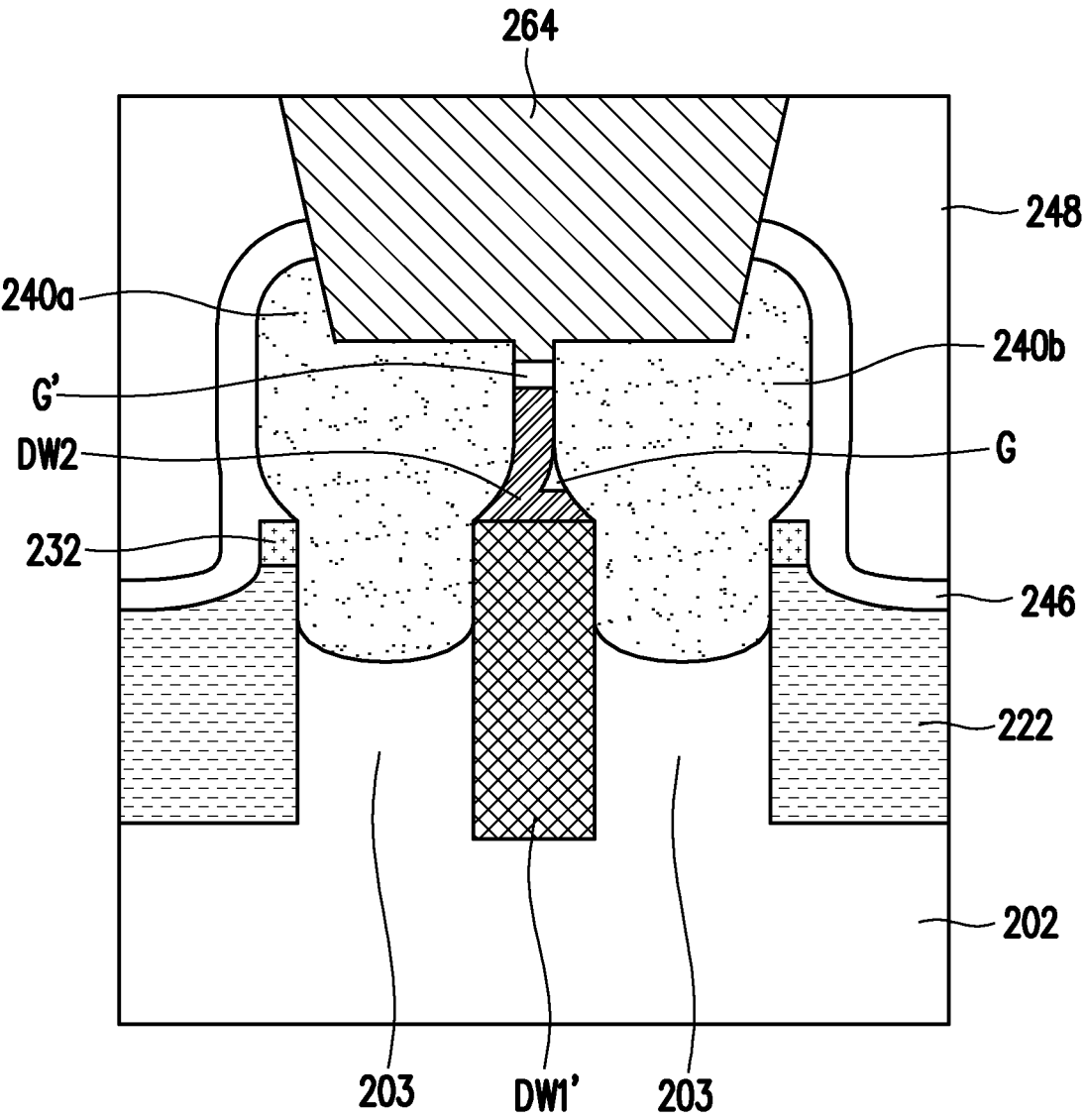
FIG. 17 illustrates a view of a cross-sectional view of a semiconductor device in accordance with some embodiments.
Figure 18:
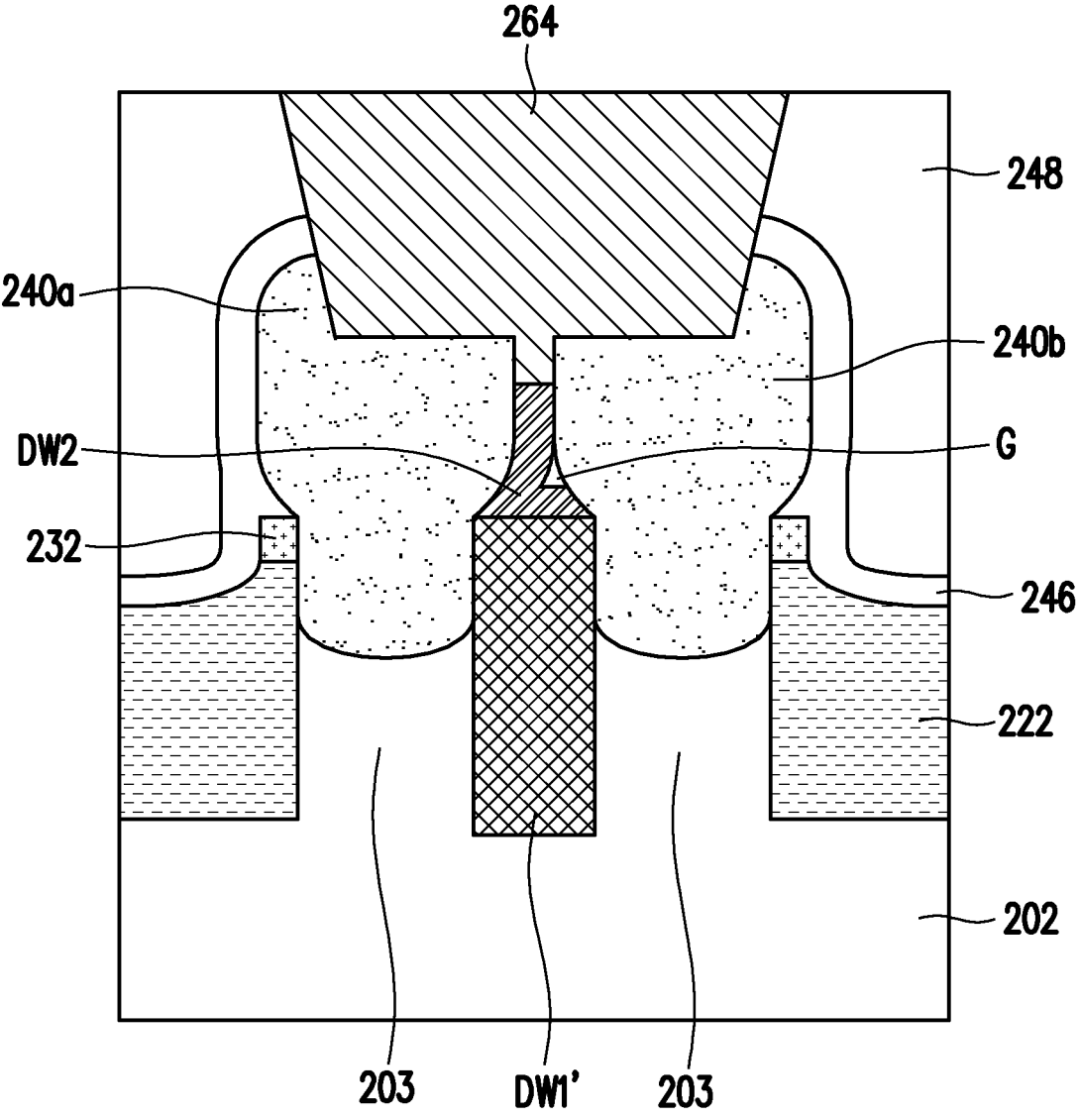
FIG. 18 illustrates a view of a cross-sectional view of a semiconductor device in accordance with some embodiments.

The cross-sectional view of FIG. 16A and FIG. 16B are similar to the cross-sectional views of FIG. 11 and FIG. 14B respectively, and the different between them lies in that an air gap G' is further formed. In some embodiments, as shown in FIG. 16A, when the CESL 246 is formed to cover the strained layers 240a, 240b, the air gap G' is formed between the CESL 246 and the dielectric wall DW2. Then, as shown in FIG. 16B, the air gap G' may remain after the formation of the contact 264, for example. In alternative embodiments, the air gap G' is partially filled by the contact 264 (as shown in FIG. 17) or entirely filled by the contact 264 (as shown in FIG. 18). It is noted that at other position rather than the position (e.g., line I-I' of FIG. 14A) where the contact 264 is to be formed, the gap G' may remain.

Figure 19A:
FIG. 19A and FIG. 19B illustrate cross-sectional views of a semiconductor device in accordance with some embodiments.
Figure 19B:

The cross-sectional views of FIG. 19A and FIG. 19B are similar to the cross-sectional views of FIG. 11 and FIG. 14B respectively. In some embodiments, the dielectric wall DW2 has multi-layer structure. For example, as shown in FIG. 19A and FIG. 19B, the dielectric wall DW2 has a plurality of dielectric layers 270a, 270b. The dielectric layer 270a is disposed on the dielectric wall DW1' and located between the strained layers 240a, 240b, and the dielectric layer 270b is disposed between the dielectric layer 270a and the strained layer 240b. The dielectric layers 270a, 270b may respectively include a dielectric material, such as silicon oxide, silicon nitride, SiON, SiC, SiCN, SiCON, or a combination thereof. Other materials such as a low-k material may be applicable. The low-k material has a dielectric constant less than 3.9, less than 3, less than 2.5, or even less. In some embodiments, the material of the dielectric layer 270a is different from the material of the dielectric layer 270b, and thus an interface exists between the dielectric layer 270a and the dielectric layer 270b. The dielectric layers 270a, 270b may have a thickness in a range of 1 nm to 5 nm.

In some embodiments, the formation of the dielectric wall DW2 includes the steps similar to those described FIG. 9 to FIG. 11. For example, the dummy spacer layer 242 of FIG. 9 includes the dielectric layer 270a and the dielectric layer 270b. The dielectric layer 270a is conformally formed on the strained layer 240a, the spacers 232, the insulating regions 222, the recess 234b and the dielectric wall DW1', and the dielectric layer 270b is conformally formed on the dielectric layer 270a. Then, as shown in FIG. 10, by using the mask 244 as a mask, the dielectric layer 270a and the dielectric layer 270b are partially removed, to expose the recess 243b. Then, the strained layer 240b is formed from the recess 243b. After that, the dielectric layer 270a and the dielectric layer 270b on the strained layer 240a are removed, to form the dielectric wall DW2 as shown in FIG. 19A.

In some embodiments, the dielectric layer 270a is conformally formed on and in direct contact with a portion of the sidewall of the strained layer 240a and the top surface of the dielectric wall DW1'. The dielectric layer 270b may be conformally formed on and in direct contact with the dielectric layer 270a. The dielectric layers 270a, 270b may respectively have a L-like cross sectional shape, and has a bottom portion 272a, 272b and a side portion 274a, 274b physically connected to the bottom portion 272a, 272b. The bottom portion 272a of the dielectric layer 270a may be disposed between the dielectric wall DW1' and the bottom portion 272b of the dielectric layer 270b. In some embodiments, a sidewall of the bottom portion 272a of the dielectric layer 270a is substantially flush with a sidewall of the bottom portion 272b of the dielectric layer 270b. The dielectric layer 270b is in direct contact with the side portion 274a and the bottom portion 272a of the dielectric layer 270a, for example. In other words, the dielectric layer 270b is in direct contact with a sidewall of the dielectric layer 270a facing the strained layer 240b. In some embodiments, an air gap G is formed between the dielectric layer 270b of the dielectric wall DW2 and the strained layer 240b. Accordingly, the contact area between the dielectric layer 270a of the dielectric wall DW2 and the strained layer 240a is different from (e.g., less than) the contact area between the dielectric layer 270b of the dielectric wall DW2 and the strained layer 240b. In some embodiments, as shown in FIG. 19A, before formation of the contact 264, top surfaces 276a, 276b of the dielectric layers 270a, 270b are lower than the top surfaces of the strained layers 240a, 240b. The top surface 276a of the dielectric layer 270a is substantially coplanar with the top surface 276b of the dielectric layer 270b, for example. A bottom surface 278b of the dielectric layer 270b is higher than a bottom surface 278a of the dielectric layer 270a, for example. In some embodiments, as shown in FIG. 19B, after formation of the contact 264, the top surfaces 276a, 276b of the dielectric layers 270a, 270b are in direct contact with the contact 264.

FIG. 20 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 300, a first stack of semiconductor nanosheets, a second stack of semiconductor nanosheets and a first dielectric wall between the first stack of semiconductor nanosheets and the second stack of semiconductor nanosheets are provided. FIG. 1A to FIG. 3B illustrate views corresponding to some embodiments of act 300.

At act 302, by removing the first stack of semiconductor nanosheets and the second stack of semiconductor nanosheets, a first recess and a second recess are formed. FIG. 5 and FIG. 6 illustrate views corresponding to some embodiments of act 302.

At act 304, a portion of the first dielectric wall is removed, wherein top surfaces of the first recess and the second recess are lower than a top surface of the first dielectric wall. FIG. 5 and FIG. 6 illustrate views corresponding to some embodiments of act 304.

At act 306, a first dummy spacer layer is formed on the first dielectric wall and the second recess while the first recess is exposed. FIG. 7 and FIG. 8 illustrate views corresponding to some embodiments of act 306.

At act 308, a first strained layer is epitaxially growing from the first recess. FIG. 8 illustrates a view corresponding to some embodiments of act 308.

At act 310, a second dummy spacer layer is formed on the first strained layer and the first dielectric wall while the second recess is exposed. FIG. 9 and FIG. 10 illustrate views corresponding to some embodiments of act 310.

At act 312, a second strained layer is epitaxially growing from the second recess. FIG. 10 illustrates a view corresponding to some embodiments of act 312.

At act 314, the second dummy spacer layer on the first strained layer is removed, wherein the second dummy spacer layer remaining between the first strained layer and the second strained layer forms a second dielectric wall on the first dielectric wall. FIG. 11 illustrates a view corresponding to some embodiments of act 314.

In accordance with some embodiments of the disclosure, a semiconductor device includes a substrate, a first stack of semiconductor nanosheets, a second stack of semiconductor nanosheets, a gate structure, a first strained layer, a second strained layer, a first dielectric wall and a second dielectric wall. The substrate includes a first fin and a second fin. The first stack of semiconductor nanosheets is disposed on the first fin, and the second stack of semiconductor nanosheets is disposed on the second fin. The gate structure wraps the first stack of semiconductor nanosheets and the second stack of semiconductor nanosheets. The first strained layer is disposed on the first fin and abutting the first stack of semiconductor nanosheets, and the second strained layer is disposed on the second fin and abutting the second stack of semiconductor nanosheets. The first dielectric wall is disposed on the substrate and located between the first strained layer and the second strained layer. The second dielectric wall is disposed on the first dielectric wall and located between the first strained layer and the second strained layer. A top surface of the second dielectric wall is lower than top surfaces of the first strained layer and the second strained layer.

In accordance with some embodiments of the disclosure, a semiconductor device includes a substrate, a first stack of semiconductor nanosheets, a second stack of semiconductor nanosheets, a gate structure, a first strained layer, a second strained layer and a first dielectric wall. The substrate includes a first fin and a second fin. The first stack of semiconductor nanosheets is disposed on the first fin, and the second stack of semiconductor nanosheets is disposed on the second fin. The gate structure wraps the first stack of semiconductor nanosheets and the second stack of semiconductor nanosheets. The first strained layer is disposed on the first fin and abutting the first stack of semiconductor nanosheets, and the second strained layer is disposed on the second fin and abutting the second stack of semiconductor nanosheets. The first dielectric wall includes a first dielectric layer and a second dielectric layer. The first dielectric layer is disposed on the substrate and located between the first strained layer and the second strained layer. The second dielectric layer is disposed between the first dielectric layer and the second strained layer, wherein a material of the first dielectric layer is different from a material of the second dielectric layer.

In accordance with some embodiments of the disclosure, a method of forming a semiconductor device includes the following steps. A first stack of semiconductor nanosheets, a second stack of semiconductor nanosheets and a first dielectric wall between the first stack of semiconductor nanosheets and the second stack of semiconductor nanosheets are provided. By removing the first stack of semiconductor nanosheets and the second stack of semiconductor nanosheets, a first recess and a second recess are formed. A portion of the first dielectric wall is removed, wherein top surfaces of the first recess and the second recess are lower than a top surface of the first dielectric wall. A first dummy spacer layer is formed on the first dielectric wall and the second recess while the first recess is exposed. A first strained layer is epitaxially growing from the first recess. A second dummy spacer layer is formed on the first strained layer and the first dielectric wall while the second recess is exposed. A second strained layer is epitaxially growing from the second recess. The second dummy spacer layer on the first strained layer is removed, wherein the second dummy spacer layer remaining between the first strained layer and the second strained layer forms a second dielectric wall on the first dielectric wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate comprising a first fin and a second fin;
   a first stack of semiconductor nanosheets disposed on the first fin;
   a second stack of semiconductor nanosheets disposed on the second fin;
   a gate structure wrapping the first stack of semiconductor nanosheets and the second stack of semiconductor nanosheets;
   a first strained layer disposed on the first fin and abutting the first stack of semiconductor nanosheets;
   a second strained layer disposed on the second fin and abutting the second stack of semiconductor nanosheets;
   a first dielectric wall disposed on the substrate and located between the first strained layer and the second strained layer; and
   a second dielectric wall disposed on the first dielectric wall and located between the first strained layer and the second strained layer, wherein a material of the second dielectric wall is different from a material of the first dielectric wall,
   wherein a top surface of the second dielectric wall is lower than top surfaces of the first strained layer and the second strained layer.

2. The semiconductor device of claim 1, wherein a bottom surface of the second dielectric wall is higher than bottom surfaces of the first strained layer and the second strained layer.

3. The semiconductor device of claim 1, wherein a width of the second dielectric wall is smaller than a width of the first dielectric wall.

4. The semiconductor device of claim 1, further comprising an air gap between the second dielectric wall and a sidewall of the second strained layer.

5. The semiconductor device of claim 1, wherein the first dielectric wall is in direct contact with and interposed between lower sidewalls of the first strained layer and the second strained layer, and the second dielectric wall is in direct contact with and interposed between upper sidewalls of the first strained layer and the second strained layer.

6. The semiconductor device of claim 1, further comprising a contact etch stop layer disposed on the top surface of the second dielectric wall and the top surfaces of the first strained layer and the second strained layer, and an air gap between the contact etch stop layer and the top surface of the second dielectric wall.

7. The semiconductor device of claim 1, further comprising an air gap defined by a sidewall of a bottom portion of the first dielectric wall and a sidewall of a bottom portion of the second dielectric wall.

8. A semiconductor device, comprising:

a substrate comprising a first fin and a second fin;

a first stack of semiconductor nanosheets disposed on the first fin;

a second stack of semiconductor nanosheets disposed on the second fin;

a gate structure wrapping the first stack of semiconductor nanosheets and the second stack of semiconductor nanosheets;

a first strained layer disposed on the first fin and abutting the first stack of semiconductor nanosheets;

a second strained layer disposed on the second fin and abutting the second stack of semiconductor nanosheets; and a first dielectric wall, comprising:

a first dielectric layer disposed on the substrate and located between the first strained layer and the second strained layer; and a second dielectric layer disposed between the first dielectric layer and the second strained layer, wherein a material of the first dielectric layer is different from a material of the second dielectric layer.

9. The semiconductor device of claim 8, further comprising a second dielectric wall between the substrate and the first dielectric wall and located between the first strained layer and the second strained layer.

10. The semiconductor device of claim 9, wherein a bottom portion of the first dielectric layer is disposed between the second dielectric wall and a bottom portion of the second dielectric layer.

11. The semiconductor device of claim 10, wherein the bottom portion of the first dielectric layer is in direct contact with the second dielectric wall.

12. The semiconductor device of claim 8, wherein a first contact area between the first dielectric layer and the first strained layer is different from a second contact area between the second dielectric layer and the second strained layer.

13. The semiconductor device of claim 8, further comprising an air gap between the second dielectric layer and a sidewall of the second strained layer.

14. The semiconductor device of claim 8, wherein the second dielectric layer is in direct contact with a side portion and a bottom portion physically connecting to the side portion of the first dielectric layer.

15. The semiconductor device of claim 8, wherein top surfaces of the first dielectric layer and the second dielectric layer are substantially coplanar, and a bottom surface of the second dielectric layer is higher than a bottom surface of the first dielectric layer.

16. The semiconductor device of claim 8, wherein top surfaces of the first dielectric layer and the second dielectric layer are lower than top surfaces of the first strained layer and the second strained layer.

17. A method of forming a semiconductor device, comprising:

providing a first stack of semiconductor nanosheets, a second stack of semiconductor nanosheets and a first dielectric wall between the first stack of semiconductor nanosheets and the second stack of semiconductor nanosheets;

by removing the first stack of semiconductor nanosheets and the second stack of semiconductor nanosheets, forming a first recess and a second recess;

removing a portion of the first dielectric wall, wherein top surfaces of the first recess and the second recess are lower than a top surface of the first dielectric wall;

forming a first dummy spacer layer on the first dielectric wall and the second recess while the first recess is exposed;

epitaxially growing a first strained layer from the first recess;

forming a second dummy spacer layer on the first strained layer and the first dielectric wall while the second recess is exposed;

epitaxially growing a second strained layer from the second recess; and removing the second dummy spacer layer on the first strained layer, wherein the second dummy spacer layer remaining between the first strained layer and the second strained layer forms a second dielectric wall on the first dielectric wall.

18. The method of claim 17, wherein during epitaxially growing the second strained layer from the second recess, an air gap is formed between the second strained layer and the second dummy spacer layer on the first strained layer.

19. The method of claim 18, wherein forming the first dummy spacer layer on the first dielectric wall and the second recess while the first recess is exposed comprises:

forming the first dummy spacer layer on the first recess, the first dielectric wall and the second recess; and by using a mask, a portion of the first dummy spacer layer on the first recess is removed.

20. The method of claim 17, further comprising:

forming a contact etch stop layer over the first dielectric wall, the first strained layer and the second strained layer; and forming an interlayer dielectric layer over the contact etch stop layer.

* * * * *